US012393219B2

(12) United States Patent
Fung et al.

(10) Patent No.: US 12,393,219 B2
(45) Date of Patent: Aug. 19, 2025

(54) STAND-BY CIRCUIT

(71) Applicant: Cambridge GaN Devices Limited, Cambridge (GB)

(72) Inventors: Sheung Wai Fung, Cambridge (GB); Martin Arnold, Cambridge (GB); Loizos Efthymiou, Cambridge (GB); Tara Vishin, Cambridge (GB); John William Findlay, Cambridge (GB); Florin Udrea, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 500 days.

(21) Appl. No.: 17/977,174

(22) Filed: Oct. 31, 2022

(65) Prior Publication Data

US 2024/0143013 A1 May 2, 2024

(51) Int. Cl.
*H02M 1/00* (2007.01)
*G05F 3/26* (2006.01)
(Continued)

(52) U.S. Cl.
CPC ........... *G05F 3/262* (2013.01); *H10D 30/475* (2025.01); *H10D 62/824* (2025.01); *H10D 62/8503* (2025.01)

(58) Field of Classification Search
None
See application file for complete search history.

(56) References Cited

U.S. PATENT DOCUMENTS 10,686,411 B2 6/2020 Li
2017/0288556 A1 10/2017 Tang et al.
(Continued)

FOREIGN PATENT DOCUMENTS

CN 108988836 A 12/2018
CN 111800115 A 10/2020
(Continued)

OTHER PUBLICATIONS

Udrea Florin et al: "The smart ICeGaNTM platform with sensing and protection functions for both enhanced ease of use and gate reliability", 2022 IEEE 34th International Symposium on Power Semiconductor Devices and ICS (ISPSD), IEEE, May 22, 2022 (May 22, 2022), pp. 41-44, XP034145116, DOI: 10.1109/ISPSD49238. 2022.9813659, [retrieved on Jul. 6, 2022] * the whole document*.

(Continued)

*Primary Examiner* — Grant S Withers
(74) *Attorney, Agent, or Firm* — Tarolli, Sundheim, Covell & Tummino LLP

(57) ABSTRACT

A III-nitride power semiconductor based heterojunction device comprising a substrate, a first terminal, a second terminal, a control terminal configured to receive an input switching signal during an active mode of operation and to not receive the input switching signal during a stand-by mode of operation, and an active heterojunction transistor formed on the substrate. The device further comprises a stand-by signal generation circuit configured to generate a stand-by signal when the input switching signal to the control terminal has not been detected for a set period of time, at least one Miller clamp transistor and driving circuitry associated with the at least one Miller clamp transistor, a voltage regulator circuit configured to provide at least a low power consumption output and a high power consumption output, wherein the low power consumption output is enabled at least during the stand-by mode of operation and the high power consumption output is disabled by the stand-by signal during the stand-by mode of operation, and a rail voltage terminal configured to provide an input to the voltage regulator circuit. The low power consumption output is provided to the driving circuitry of the at least one Miller clamp transistor to thereby maintain the at least one Miller clamp transistor in an on-state during the stand-by (Continued)

mode of operation, and the low power consumption output is provided to the stand-by signal generation circuit to thereby power up the stand-by signal generation circuit.

27 Claims, 14 Drawing Sheets

(51) Int. Cl.
  *H10D 30/47* (2025.01)
  *H10D 62/824* (2025.01)
  *H10D 62/85* (2025.01)

(56) References Cited

U.S. PATENT DOCUMENTS

| | | |
|---|---|---|
| 2018/0294813 A1 | 10/2018 | Cascio et al. |
| 2020/0014195 A1 | 1/2020 | Ye et al. |
| 2021/0335781 A1 | 10/2021 | Arnold et al. |
| 2022/0310832 A1 | 9/2022 | Udrea et al. |

FOREIGN PATENT DOCUMENTS

| | | |
|---|---|---|
| TW | 202109771 A | 3/2021 |
| WO | 2020001553 A1 | 1/2020 |
| WO | 2020225362 A1 | 11/2020 |

OTHER PUBLICATIONS

Wang Li et al: "Design of Transient Enhanced LDO Circuit for GaN HEMT Gate Driver", 2021 6th International Conference on Integrated Circuits and Microsystems (ICICM), IEEE, Oct. 22, 2021 (Oct. 22, 2021), pp. 40-44, XP034064163, DOI: 10.1109/ICICM54364. 2021.9660317, [retrieved on Dec. 21, 2021] * figure 8 *.

European Search Report and Written Opinion issued on May 22, 2023, corresponding to Luxemourg patent App. No. 50304, pp. 2-10.

Taiwanese Office Action for TW application No. 112141807, dated Aug. 21, 2024, 10 pages.

Combined Search and Examination Report for GB application No. GB2316637.4, dated May 1, 2024, 5 pages.

STAND-BY CIRCUIT

FIELD OF THE DISCLOSURE

The present disclosure relates to power consumption in integrated circuits. Particularly, but not exclusively, the disclosure relates to power consumption during a no-load condition in GaN integrated circuits.

BACKGROUND OF THE DISCLOSURE

Power semiconductor devices are semiconductor devices used as a switch or rectifier in power electronics (for example, a DC to AC inverter for motor control or a DC to DC converter for switched-mode power supplies). A power semiconductor device is often used in a so-called "commutation mode" in which the power semiconductor device is either on or off, and therefore often have designs optimized for such usage.

In use, a power semiconductor device in a power electronics circuit (such as a switch mode power supply) may operate in the commutation mode when a load is connected to the output of the circuit. However, power electronics circuits may also operate in a no-load condition for significant periods of time, in which an input voltage is provided to the power supply but no load is connected to the output.

During a no-load operation (i.e., operation under a no load condition) there are restrictions on the power dissipated by the circuit. The power semiconductor device is a contributor to the power dissipated during no-load operation, and therefore this should be taken into consideration when designing the power semiconductor device. During no-load operation the power semiconductor device is often in the off-state mode of operation, and therefore the power dissipation in the device is controlled by the off-state voltage across the device and the leakage current of the device at that (off-state) voltage.

At low to medium power voltages, where lateral semiconductor technologies are more competitive and therefore monolithic integration is more feasible, the power semiconductor device in a power electronic circuit may in some circumstances be replaced by a power integrated circuit (IC). The power integrated circuit may contain additional features, including features that are monolithically integrated with the power device such as gate driving, sensing and protection blocks, temperature sensing units and Miller clamps. These additional functional blocks can be powered by one or more voltage signals applied to the power integrated circuit (e.g. a VDD signal). One or more voltage regulators may also be used in the power integrated circuit to step the input voltage signal up or down according to what is needed for functional blocks in the circuit.

The additional functional blocks of the power integrated circuit add to the power dissipation of the device in all conditions. When a load is connected, the power dissipation in the additional functional blocks may be small or negligible compared to the power dissipation in the power semiconductor device. However, in the no-load condition, where the power dissipation in the power semiconductor device significantly reduces, the dissipation in the additional functional blocks of the integrated circuit can become significant.

GaN power integrated circuits are becoming more popular in the market. The power semiconductor device in a GaN power integrated circuit is often a GaN high electron mobility transistor (HEMT) based on the AlGaN/GaN heterojunction. While other gate technologies exist, a popular method of designing enhancement mode GaN HEMTs as power devices is through the use of the p-GaN gate. An integrated circuit implemented in GaN often comprises low voltage enhancement mode and depletion mode transistors as well as passive components such as resistors, capacitors etc. P-channel device technology is not very mature in GaN.

As such, the Applicant has recognised a need to provide an improved solution to the issue of power dissipation during a no-load condition in integrated circuits, and in particular for GaN integrated circuits which generally may lack p-channel devices for use in inverter circuits.

SUMMARY

It is an object of the present disclosure to provide a reduction of the power consumption or dissipation of a power integrated circuit operating in a no-load condition, for example while in a stand-by mode.

According to a first aspect of the present disclosure, there is provided a III-nitride power semiconductor based heterojunction device comprising:
  a substrate;
  a first terminal;
  a second terminal;
  a control terminal configured to receive an input switching signal during an active mode of operation and to not receive the input switching signal during a stand-by mode of operation;
  an active heterojunction transistor formed on the substrate, the active heterojunction transistor comprising:
    a first III-nitride semiconductor region comprising a first heterojunction comprising an active two-dimensional carrier gas;
    a source terminal operatively connected to the III-nitride semiconductor region and further connected to the first terminal;
    a drain terminal laterally spaced from the first terminal and operatively connected to the III-nitride semiconductor region, the drain terminal operatively connected to the second terminal; and
    an active gate region formed over the III-nitride semiconductor region and between the first terminal and the second terminal;
  a stand-by signal generation circuit configured to generate a stand-by signal when the input switching signal to the control terminal has not been detected for a set period of time;
  at least one Miller clamp transistor and driving circuitry associated with the at least one Miller clamp transistor;
  a voltage regulator circuit configured to provide at least a low power consumption output and a high power consumption output, wherein the low power consumption output is enabled at least during the stand-by mode of operation and the high power consumption output is disabled by the stand-by signal during the stand-by mode of operation; and
  a rail voltage terminal configured to provide an input to the voltage regulator circuit;
  wherein the low power consumption output is provided to the driving circuitry of the at least one Miller clamp transistor to thereby maintain the at least one Miller clamp transistor in an on-state during the stand-by mode of operation; and
  wherein the low power consumption output is provided to the stand-by signal generation circuit to thereby power up the stand-by signal generation circuit.

According to another aspect of the present disclosure there is provided a III-nitride power semiconductor based heterojunction device (also termed in this disclosure as the GaN chip or GaN Power integrated circuit) comprising at least a first terminal, a second terminal and a control terminal and further comprising a substrate and further comprising:

a rail voltage terminal
an active heterojunction transistor (also termed the high voltage HEMT or the main HEMT) formed on a substrate, the active heterojunction transistor comprising:
a first III-nitride semiconductor region comprising a first heterojunction comprising an active two-dimensional carrier gas;
a source terminal operatively connected to the III-nitride semiconductor region and further connected to the first terminal;
a drain terminal laterally spaced from the first terminal and operatively connected to the III-nitride semiconductor region and further connected to the second terminal;
an active gate region formed over the III-nitride semiconductor region and between the first terminal and the second terminal;
whereby the GaN power integrated circuit receives an input switching signal to the control terminal during the active mode of operation and does not receive an input switching signal to the control terminal during the stand-by mode of operation;
and further comprises at least:
one standby signal generation circuit block which generates a standby signal when the input switching signal to the control terminal has not been detected for a set period of time; and
one circuit block or a group of circuit blocks which are only operational when a standby signal is not detected.

Optionally the power semiconductor based heterojunction device may further comprise one or more of:
one voltage regulator circuit block connected with the rail voltage terminal as an input; and
one circuit block or a group of circuit blocks which are operational irrespective of the standby signal.

The heterojunction device is configured such that a lack of detection of the switching signal to the control terminal for a set period of time enables or disables the operation of selected circuit blocks, to minimise the power consumption of the GaN power integrated circuit during certain modes of operation.

A no load condition, no load operation or "stand-by mode" of a power device such as a power integrated circuit (IC) is, broadly speaking, characterised by the power device HEMT being in the off-state for a longer time (by a given margin, e.g. 100 microseconds) than the maximum time for which the device is in the off-state as part of the switching events of the power device. In the stand-by mode, a power device blocks the voltage across its main terminals (i.e. drain to source). The power electronics system, which employs the power device or the power IC, may be in this case "idle", as no load is connected to the output, and the power device does not switch, but remains in its off-state.

A low power consumption is sometimes helpful in certain applications to meet the restrictions set by regulations or by the expectations of the power electronics designer. Embodiments of the present invention aim to maintain the speed of operation of the additional functional blocks during "active" or "normal" (i.e. load connected) operations, while concurrently reducing the power consumption of the power device in a stand-by mode.

During the active mode, in which a load is connected to the output of the power electronics system, the power transistor may switch from ON to OFF and vice versa, or in some cases may remain in the on-state. The off-state pulse in this mode is considered to be part of the switching event and is therefore generally lasts for an amount of time that is smaller than a certain value (e.g. less than 100 microseconds).

Embodiments of the invention address a requirement for low power consumption during the stand-by mode, and efficient operation during the active mode. In the stand-by mode of the power integrated circuit some, most, or all of the additional functional blocks may be disabled, such that they no longer dissipate power (or dissipate a very low amount of power) and therefore stop contributing (significantly) to the overall power dissipation of the circuit. These blocks are enabled during active operation, and therefore do contribute to the overall power dissipation of the circuit in the active mode.

It will be understood that a transition between the active operation mode and the standby mode (and vice versa) may occur at certain stages during the operation of the circuit, and that these stages need to be considered during the design of the power device and/or integrated circuit such that the power electronic circuit operates as intended.

It will further be understood that some of the functional blocks of the power device may remain operational during the stand-by mode (i.e. under a no-load condition). This may provide a safer and/or a more robust operation of a power integrated circuit and therefore the overall power electronic circuit.

One example of a functional block for use in a power integrated circuit is a Miller clamp or Miller clamps. For example, the power integrated circuit may comprise two or more Miller clamps, or a combination of two or more Miller clamps, and their associated circuitry. Such Miller clamps may be connected in parallel but controlled or act based on different signal, e.g. as a result of different input signals being provided to their respective gates. During a no-load (stand-by) condition, a first Miller clamp may protect the power semiconductor device against or otherwise reduce the effect of parasitic dV/dt transients, which may e.g. lead to a spurious turn-on of the power integrated circuit while the device is supposed to be in the stand-by mode.

The first Miller clamp can be, for example, in an on-state (i.e. have a low resistance) when the power device is in the stand-by mode to protect the power device, as it keeps locally the gate potential of the power device close to the source potential of the power device, effectively short-circuiting these two terminals. In implementations, the first Miller clamp may also be active during the active mode (e.g. when the power device undergoes switching operations).

The second Miller clamp may be provided in the form of a transistor with a higher on-state current capability (i.e. an even lower on-state resistance) than the first Miller clamp. The second Miller clamp may facilitate a faster and more efficient operation during the active mode of the main power device. This second Miller clamp may have lower on-state resistance than the first Miller clamp, and together with its associated circuitry may consume more power than the first Miller clamp and its associated circuitry. The second Miller clamp can for example more effectively absorb dV/dt displacement currents during turn-off without the risk of re-triggering in the on-state the power device.

The second Miller clamp transistor may form part of a pull-down circuit, the pull-down circuit comprising a distributed network of pull-down sub-circuits connected to a network of active heterojunction sub-transistors. In this case, the heterojunction device may optionally be connected in parallel to one or more second heterojunction devices, such that:
the control terminal of the heterojunction device is operably connected to a control terminal of the one or more second heterojunction devices;
the drain terminal of the heterojunction device is operably connected to a drain terminal of the one or more second heterojunction devices;
the source terminal of the heterojunction device is operably connected to a source terminal of the one or more second heterojunction devices; and
wherein a gate of the second Miller clamp transistor is operatively connected to corresponding gates of second Miller clamp transistors of the one or more second heterojunction devices.

To reduce the no-load (or stand-by) power consumption, the second Miller clamp may be disabled (e.g. in an off-state) during the stand-by mode.

It will be understood that the power device may be provided with only a single Miller clamp, for example only one of first and second Miller clamps described above.

Alternatively, a single (combined) Miller clamp (and associated circuitry) may be provided having a dual action, to facilitate a low on-state resistance of the Miller clamp (and a higher power consumption) in the active mode, and a higher on-state resistance of the Miller clamp (and a lower power consumption) in the standby mode. For example, the combined Miller clamp may comprise a normally-off transistor that can be ON when its gate is at the same potential as its source. Such a design may be especially beneficial during the stand-by mode. Advantageously, utilising a double (or other multiple) Miller clamp facilitates the separate optimisation of the devices and the auxiliary circuitry, to provide an improved trade-off between the efficiency/speed of the power device during the active mode and an enhanced protection and low stand-by power consumption of the power device during the stand-by mode.

A power device such as a power integrated circuit may comprise an under-voltage lock out (UVLO). The UVLO may assist in protecting against non-ideal operations of the power device. This often refers to the function where if the rail voltage signal, VDD of the power integrated circuit drops below a certain value, the power semiconductor device is no longer allowed to switch i.e. is not in commutation or active mode. This may be implemented by disconnecting a control signal, also called a control switching signal or an input switching signal, for the power integrated circuit from the gate terminal of the power semiconductor device.

The "set period of time" is generally longer or significantly longer than the maximum period of OFF time when the device is in the active mode (i.e., longer than the period between the device switching to the off-state and back to the on-state during active operation). This assists in distinguishing between the stand-by mode (when the transistor is in the OFF state) and the period of time in the active mode when the transistor is in the OFF part of the switching pulse.

In one example implementation, the active heterojunction transistor may comprise a power High-electron-mobility transistor (HEMT), such as a pGaN gate HEMT. The device may comprise an AlGaN layer and a GaN layer forming a heterojunction where a two dimensional electron gas (2DEG) is present. The 2DEG may act as a conduction path during the on-state operation of the transistor. The HEMT may further comprise a transition layer, a silicon substrate, a substrate terminal, passivation layers, a source terminal, a drain terminal, a gate terminal, and a highly p-doped GaN.

In some example implementations, the power device may be a lateral three-terminal device with an AlGaN/GaN heterostructure grown epitaxially on a standard silicon (Si) wafer. The transition layer may facilitate the growth of a high quality GaN layer despite the significant lattice mismatch between the GaN and Si layers. Carbon p-type doping is often added in the GaN layer. Finally, a thin and patterned GaN layer may be provided to form a gate with a Magnesium (Mg) p-type doping density greater than $1 \times 10^{19}$ cm$^{-3}$.

A typical pGaN gate device with this construction has a threshold voltage of ~1.5-2V and maximum allowable gate bias voltage of <8V.

In one example, the standby signal generation circuit may comprise a network of enhancement mode/depletion mode transistors and current sources which can receive the control signal as the input.

If the control signal is high, the network connects a capacitor to a voltage rail terminal such that the capacitor gets charged and/or becomes fully charged. The voltage rail (terminal) may be applied externally or may be a regulated voltage rail generated on the integrated circuit. If the control signal is low, the network allows a capacitor to be discharged according to a set current. The discharge current may be set by e.g. a current mirror. Alternatively, it may be discharged through a resistor forming an RC network.

The control signal in active operation is constantly or frequently switching from high to low. During this operation the capacitor will be near full charge, for any reasonable duty cycle, as the charging path may be less resistive than the discharge path. The capacitor may be connected as the input of an inverter, such that when the device is in active operation and the capacitor is fully charged, the output of the inverter is low. Similarly, when in active operation, the output of the stand-by signal circuit is low, and the output of the inverter may be used as a stand-by detection output signal.

If a long period of no switching occurs, for example because the control signal stops switching, the capacitor will eventually discharge, and the output of the stand-by circuit will go from low to high.

A regulated voltage rail terminal may be provided as an output of the voltage regulator circuit block. The regulated voltage rail terminal may be used to supply power to any of the GaN power integrated circuit blocks described herein.

In one example, the voltage regulator may receive the voltage rail terminal input voltage as an input signal. The voltage rail terminal may step the input voltage down (or up) to an appropriate regulated voltage rail to supply voltage to the integrated circuit blocks.

The voltage regulator may have two operation modes: a high power consumption and a low power consumption mode. The high power consumption mode may be selected during active operation, while the low power consumption mode may be selected during no-load or stand-by operations. The voltage regulator may receive the stand-by detection output signal as an additional input, and the selection of the high power or low power consumption mode may therefore occurs based on the stand-by detection output signal.

In another example, rather than a single voltage regulator with two power consumption modes, the integrated circuit may comprise two voltage regulators, a first voltage regulator with a low power consumption and a second voltage regulator with a high power consumption. In this case, the high power consumption voltage regulator may be disabled during no-load or stand-by operations, for example based on the stand-by detection output signal. In this example, the voltage regulator circuit, which comprises two voltage regulators, may therefore comprise a high power consumption output (also called a high power consumption output rail) and a low power consumption output (also called a low power consumption output rail).

In some examples, the voltage regulator may comprise an enhancement or depletion mode transistor or HEMT, also referred to as the main HEMT. The HEMT may be operatively connected in series between the input and the output of the voltage regulator, a current source connected between the input and the gate of the in-series HEMT, a second enhancement mode transistor with its drain connected to the gate of the in-series HEMT and a potential divider where the midpoint of the potential divider is connected to the gate of the second enhancement mode transistor.

In another example, the voltage regulator may comprise a depletion mode transistor or HEMT. The depletion mode HEMT may have the same or a similar voltage rating as the active heterojunction transistor (i.e. the main HEMT). Optionally, the voltage regulator may also comprise a resistor connected in series with the source of the depletion mode HEMT.

The gate of the depletion mode HEMT may be connected to the source terminal of the main HEMT, and the drain of the depletion mode HEMT may be connected to the drain terminal of the main HEMT. Alternatively, the drain of the depletion mode HEMT may be provided as an additional external terminal. The source of the depletion mode HEMT may be operatively connected (optionally via a resistor) to the output of the voltage regulator. In some examples, the source of the depletion mode HEMT may be operatively connected to the low power consumption output rail of the voltage regulator.

For example, the voltage regulator may comprise a depletion mode transistor, and:
  a voltage rating of the depletion mode transistor is substantially equal to a voltage rating of the active heterojunction transistor;
  a gate terminal of the depletion mode transistor is operatively connected to the source terminal of the active heterojunction transistor;
  a drain terminal of the depletion mode transistor is either operatively connected to the drain terminal of the active heterojunction transistor or provided as an additional external terminal; and
  a source terminal of the depletion mode transistor is operatively connected to the low power consumption output.

Optionally, the heterojunction device may comprise a resistor operatively connected in series between the source terminal of the depletion mode transistor and the low power consumption output.

The circuit in this example may allow the voltage regulator to draw power from the high voltage rail terminal of the power electronics circuit, rather than e.g. from a voltage rail terminal input voltage, VDD.

Some circuit blocks of the integrated circuit may receive the stand-by detection output signal, and may be configured to be disabled when the stand-by condition is detected. This may reduce or minimise the power consumption of the circuit blocks during the stand-by operations. When the stand-by signal is not detected, these circuit blocks may similarly be enabled. Examples of circuit blocks which may be configured on this way include, but are not limited to, current sense amplifiers, over-current protection circuits, temperature sensing circuits, and over-temperature protection circuits. Example of other circuits which may be present as monolithically integrated circuits, but which may not need to be powered up in a stand-by mode, include under-voltage detection circuits, slew rate adjustment circuits and/or lifetime monitoring circuits.

Another circuit block which may be configured to be OFF or disabled during stand-by operations may comprise at least one Miller clamp transistor. The circuit block may further comprise other circuitry for driving the at least one Miller clamp transistor.

This circuit block may be defined as a pull-down circuit for e.g. the gate terminal of the active heterojunction transistor (i.e. the power device or the main transistor). Generally speaking, a trade-off may exist between the power consumption and the speed of a pull-down circuit. Where the pull-down circuit is enabled (i.e. not disabled) during stand-by operations, the pull-down circuit may be optimised to offer reduced power dissipation as a fast pull-down is not required during stand-by condition. Low power dissipation during stand-by condition may be of more significance to meet the requirements for power dissipation in the no-load condition.

The pull-down circuit may comprise a distributed network of pull-down sub circuits, operatively connected in parallel to a network of multiple active heterojunction sub-transistors. By providing a pull-down sub-circuit in closer proximity to a sub-transistor, the pull-down speed may be improved, due to the reduction of parasitics in the connection between the Miller clamp sub-transistor and the active heterojunction sub-transistor. This arrangement may also provide improved immunity to dV/dt transients.

In another example, only parts of the pull-down circuit may be in a distributed network. For example, only the Miller clamp transistor may be distributed in sub-transistors, whereas the circuit which drives the Miller clamp transistor (e.g. an inverter) may comprise a single (non-distributed) circuit configured to drive all of the Miller Clamp sub-transistors.

The power device may additionally or alternatively comprise circuit blocks which do not receive the standby detection output signal as an input, and as such are configured to operate irrespective of whether the stand-by condition is detected.

One example circuit block which may be configured in this way is a Miller clamp transistor, and/or other circuitry for driving the Miller clamp transistor. This circuit block may be defined as a pull-down circuit for the gate terminal of the active heterojunction transistor (i.e. the power device or the main transistor). As described above, generally a trade-off may exist between the power consumption and the speed of a pull-down circuit. Where the pull-down circuit is in a low power mode (or in some cases disabled) during stand-by operations, the pull-down circuit may be optimised to offer faster pull-down speeds, at the cost of increased power consumption during 'active operations'.

In some examples, the circuit which drives the Miller clamp transistor may be configured to receive the control signal as an input signal. Alternatively, the circuit which drives the Miller clamp transistor may be configured to receive a conditioned version of the control signal. For example, the switching control signal may be stepped down (or up) in magnitude before being provided to the circuit which drives the Miller clamp transistor as an input.

In implementations, the switching control signal may be applied directly to the gate terminal of the active heterojunction transistor.

The switching control signal may be conditioned using an auxiliary circuit block (or auxiliary gate interface), such as that described in PCT publication No. WO2020/225362, before being applied to the gate terminal of the active heterojunction transistor.

According to a second aspect of the present disclosure there is provided a III-nitride power semiconductor based heterojunction device (also termed in this disclosure as the GaN chip or GaN Power integrated circuit) comprising at least a first terminal, a second terminal and a control terminal and further comprising a substrate and further comprising:
  a rail voltage terminal
    an active heterojunction transistor (also termed the high voltage HEMT or the main HEMT) formed on a substrate, the active heterojunction transistor comprising:
  a first III-nitride semiconductor region comprising a first heterojunction comprising an active two-dimensional carrier gas;
  a source terminal operatively connected to the III-nitride semiconductor region and further connected to the first terminal;
  a drain terminal laterally spaced from the first terminal and operatively connected to the III-nitride semiconductor region and further connected to the second terminal;
  an active gate region formed over the III-nitride semiconductor region and between the first terminal and the second terminal;
  whereby the GaN power integrated circuit receives an input switching signal to the control terminal during the active mode of operation and does not receive an input switching signal to the control terminal during the stand-by mode of operation;
  and further comprises at least:
  one standby signal generation circuit block which generates a standby signal when the input switching signal to the control terminal has not been detected for a set period of time; and
  one Miller clamp transistor and associated driving circuitry of the Miller clamp transistor; and
  one voltage regulator circuit block connected with the rail voltage terminal as an input; and
  wherein the voltage regulator delivers at least two output rails, defined as a low power consumption output rail and a high power consumption output rail, and
  wherein the low power consumption output rail is enabled during at least the stand-by mode of operation, and
  wherein the high power consumption output rail is disabled during stand-by mode of operation through the action of the signal generated by the standby signal generation circuit block, and
  wherein the low power consumption output rail is used to keep the at least one Miller clamp in the on-state mode of operation during stand-by mode of operation by powering up the associated driving circuitry of said Miller clamp, and
  wherein the low power consumption output rail is used to power up the stand-by signal generation circuit.

Optionally, the power semiconductor based heterojunction device may further comprise a capacitor connected between the high power consumption output rail and the source terminal and/or a capacitor connected between the low power consumption output rail and the source terminal. The capacitance connected to the high power consumption output rail, if provided, may discharge to ground during the stand-by mode of operation, thus disabling circuits connected only to the high power consumption output rail but not those connected to the low power consumption output rail.

When enabled, the circuit delivering the high power consumption output rail may draw a significantly higher quiescent current than the circuit delivering the low power consumption output rail.

A decoupling circuit may be provided between the high power consumption output rail of the voltage regulator and the input of at least some of the circuit blocks of the power IC. For example, the decoupling circuit may be provided between the high power consumption output rail of the voltage regulator and an input of a Miller clamp transistor and other circuitry for driving the Miller clamp transistor. The decoupling circuit may be configured to filter high frequency signals which from the output of the voltage regulator.

Optionally, the stand-by signal may act as an input to the decoupling circuit, and the decoupling circuit may be configured to be enabled or disabled based on this signal.

In implementations, the de-coupling circuit is configured to operate as a low pass filter.

One or more circuit blocks, such as a group of circuit blocks, which are configured to be operational irrespective of the stand-by signal may be directly connected to the low power consumption output rail. Alternatively, this circuit block or these circuit blocks may be indirectly connected to the low power consumption output rail through e.g. the use of level-shifting source-gate connected HEMTs or a fixed gate bias HEMT. Similarly, one or more circuit blocks, such as a group of circuit blocks, which are only operational when a stand-by signal is not detected may be directly connected to the high power consumption output rail.

In these configurations, the decoupling circuit may be operatively connected between the high power consumption output rail of the voltage regulator and the low power consumption output rail of the voltage regulator, and may be configured to be enabled or disabled by the stand-by signal. When the stand-by signal is not detected (or a low signal is detected), the de-coupling circuit may be enabled, and connect the high power consumption output rail to the low power consumption output rail (or to the level shifted low power consumption output rail, when present). When stand-by signal is detected (i.e. when a high enough signal is detected), the de-coupling circuit may be disabled, and dis-connects the high power consumption output rail from the low power consumption mode output rail (or the level shifted low power consumption output rail, when present).

In some examples, at least two power device GaN chips as described in this invention may be used in parallel as in high power applications it may be desirable to parallel more than one chip. In such an example the GaN chips may comprise an auxiliary gate interface and a double Miller clamp (one optimized for stand-by operation and one optimized for active switching operation). Additional connections may be made between the internal gate terminals of the active heterojunction transistor and/or the gates of the active Miller clamps (which may be available externally as extra pins) such that when connected in parallel, and when switching, the first Miller clamp that comes on switches all the other main HEMT transistors in the chip off. This may be beneficial to avoid delays due to different parasitics within the integrated circuit of each chip for example due to process variation. Additionally, it may be beneficial due to different parasitics due to PCB level routing.

For example, the heterojunction device may be connected in parallel to one or more second heterojunction devices, such that:
  a. the control terminal of the heterojunction device is operably connected to a control terminal of the one or more second heterojunction devices;
  b. the drain terminal of the heterojunction device is operably connected to a drain terminal of the one or more second heterojunction devices; and
  c. the source terminal of the heterojunction device is operably connected to a source terminal of the one or more second heterojunction devices.

In implementations, the active gate region of the active heterojunction transistor is operatively connected to corresponding active gate regions of the one or more second heterojunction devices. Additionally or alternatively, a gate of the Miller clamp transistor is operatively connected to corresponding gates of Miller clamp transistors of the one or more second heterojunction devices. In this case, the Miller clamp transistor may comprise Miller clamp sub-transistors, such that one or more gates of the Miller clamp sub-transistors are operatively connected to corresponding gates of Miller clamp sub-transistors of the one or more second heterojunction devices.

In a similar example, at least two power device GaN chips connected in parallel in the manner described above may comprise a distributed network of pull-down sub circuits connected to a network of multiple active heterojunction sub-transistors as described in earlier examples.

According to a further aspect of the present disclosure there is provided a III-nitride power semiconductor based heterojunction device (also termed in this disclosure as the GaN chip or GaN Power integrated circuit) comprising at least a first terminal, a second terminal and a control terminal and further comprising a substrate and further comprising:
  a rail voltage terminal;
  an active heterojunction transistor (also termed the high voltage HEMT or the main HEMT) formed on a substrate, the active heterojunction transistor comprising:
  a first III-nitride semiconductor region comprising a first heterojunction comprising an active two-dimensional carrier gas;
  a source terminal operatively connected to the III-nitride semiconductor region and further connected to the first terminal;
  a drain terminal laterally spaced from the first terminal and operatively connected to the III-nitride semiconductor region and further connected to the second terminal;
  an active gate region formed over the III-nitride semiconductor region and between the first terminal and the second terminal;
  whereby the GaN power integrated circuit receives an input switching signal to the control terminal during the active mode of operation and does not receive an input switching signal to the control terminal during the stand-by mode of operation;
  and wherein the heterojunction device further comprises at least:
  one stand-by signal generation circuit block which generates a stand-by signal when the input switching signal to the control terminal has not been detected for a set period of time;
  one voltage regulator circuit block connected with the rail voltage terminal as an input;
  one circuit block or a group of circuit blocks which are only operational when a stand-by signal is not detected;
  one circuit block or a group of circuit blocks which are operational irrespective of the stand-by signal;
  wherein the lack of detection of the switching signal to the control terminal for a set period of time, enables or disables the operation of selected circuit blocks to minimise the power consumption of the GaN power integrated circuit during certain modes of operation;
  one under voltage detection circuit block which generates an under voltage condition signal when the input voltage signal drops below a selected value;
  wherein the detection of an under voltage condition signal disconnects the control signal from the gate terminal of the active heterojunction transistor.

The under voltage detection circuit block, also called an under voltage detection circuit, may comprise a potential divider. A midpoint of the potential divider may be connected to the input of an inverter, where the input voltage signal is the potential being divided. If the input voltage signal drops below a desirable level (as set by the potential divider), then the inverter output will go from low to high. The inverter may be configured to drive a transistor, which can in turn discharge a capacitor. Therefore, if the input voltage signal drops below a desirable (set) level, then the capacitor discharges, and will eventually be discharged to zero.

The capacitor may be connected to the input of a second inverter, such that when the capacitor is discharged, the output of the second inverter is high and when the capacitor is charged, the output of the second inverter is low. The output of the second inverter may be configured to operate as an under voltage condition signal.

In some examples, the voltage regulator supplies power to a stand-by signal generation circuit, the under voltage detection circuit and any other circuit blocks included in the power device.

In some examples, the heterojunction device may comprise a UVLO configured to generate an under voltage condition signal when an input voltage signal to the rail voltage terminal drops below a threshold value. The heterojunction device is configured to disconnect the input switching signal from the gate terminal of the active heterojunction transistor upon a detection of the under voltage condition signal.

Optionally, the UVLO is configured to receive an input voltage signal from the rail voltage terminal, and comprise a potential divider, wherein a midpoint of the potential divider is configured to provide a voltage signal which divides the input voltage signal according to the ratio of resistors in the potential divider. In some examples, the under voltage detection circuit potential divider resistive ratio may be dependent on whether the UVLO signal transition is from low to high or high to low.

The UVLO may further comprise a capacitor, and the heterojunction device may be configured to charge the capacitor when the divided input voltage signal is above a threshold level and discharge the capacitor when the divided input voltage signal is below the threshold level. Where the UVLO comprises such a capacitor, the UVLO may be configured to provide a first output when the capacitor charge is above a threshold level and a second output when the capacitor charge is below the threshold level.

In some examples, the UVLO signal may instead or also be used to change the voltage regulator from a high dissipation power mode to a low power dissipation mode, as previously described.

According to a further aspect of the present disclosure, there is provided a voltage regulator circuit for use in a III-nitride power semiconductor based heterojunction device (also termed in this disclosure as the GaN chip or GaN Power integrated circuit). The voltage regulator circuit is configured to provide at least a low power consumption output and a high power consumption output, wherein the low power consumption output is enabled at least during the stand-by mode of operation and the high power consumption output is disabled by the stand-by signal during the stand-by mode of operation. The III-nitride power semiconductor based heterojunction device may be any suitable heterojunction device, for example a heterojunction device according to any implementation of the present disclosure.

For example, a heterojunction device may be a III-nitride power semiconductor based heterojunction device may comprise:
 a substrate;
 a first terminal;
 a second terminal;
 a control terminal configured to receive an input switching signal during an active mode of operation and to not receive the input switching signal during a stand-by mode of operation;
 an active heterojunction transistor formed on the substrate, the active heterojunction transistor comprising:
  a first III-nitride semiconductor region comprising a first heterojunction comprising an active two-dimensional carrier gas;
  a source terminal operatively connected to the III-nitride semiconductor region and further connected to the first terminal;
  a drain terminal laterally spaced from the first terminal and operatively connected to the III-nitride semiconductor region, the drain terminal operatively connected to the second terminal; and
  an active gate region formed over the III-nitride semiconductor region and between the first terminal and the second terminal;
 a stand-by signal generation circuit configured to generate a stand-by signal when the input switching signal to the control terminal has not been detected for a set period of time;
 a voltage regulator circuit configured to provide at least a low power consumption output and a high power consumption output, wherein the low power consumption output is enabled at least during the stand-by mode of operation and the high power consumption output is disabled by the stand-by signal during the stand-by mode of operation; and
 a rail voltage terminal configured to provide an input to the voltage regulator circuit;
 wherein the low power consumption output is provided to the stand-by signal generation circuit to thereby power up the stand-by signal generation circuit.

The voltage regulator circuit may comprise a depletion mode transistor, wherein:
 a voltage rating of the depletion mode transistor is substantially equal to a voltage rating of an active heterojunction transistor of the III-nitride power semiconductor based heterojunction device;
 a gate terminal of the depletion mode transistor is operatively connected to the source terminal of the active heterojunction transistor;
 a drain terminal of the depletion mode transistor is either operatively connected to the drain terminal of the active heterojunction transistor or provided as an additional external terminal; and
 a source terminal of the depletion mode transistor is operatively connected to the low power consumption output.

A rail voltage terminal may be configured to provide an input to the voltage regulator circuit.

According to a further aspect of the present disclosure, there is provided an under voltage detection circuit, also called an under voltage lock out circuit (UVLO) for use in a III-nitride power semiconductor based heterojunction device (also termed in this disclosure as the GaN chip or GaN Power integrated circuit). The UVLO is configured to generate an under voltage condition signal when an input voltage signal drops below a threshold value, and the heterojunction device is configured to disconnect the control signal from the gate terminal of the active heterojunction transistor upon a detection of the under voltage condition signal. The III-nitride power semiconductor based heterojunction device may be any suitable heterojunction device, for example a heterojunction device according to any implementation of the present disclosure.

For example, a heterojunction device may be a III-nitride power semiconductor based heterojunction device may comprise:
 a substrate;
 a first terminal;
 a second terminal;
 a control terminal configured to receive an input switching signal during an active mode of operation and to not receive the input switching signal during a stand-by mode of operation;
 an active heterojunction transistor formed on the substrate, the active heterojunction transistor comprising:
  a first III-nitride semiconductor region comprising a first heterojunction comprising an active two-dimensional carrier gas;
  a source terminal operatively connected to the III-nitride semiconductor region and further connected to the first terminal;
  a drain terminal laterally spaced from the first terminal and operatively connected to the III-nitride semiconductor region, the drain terminal operatively connected to the second terminal; and
  an active gate region formed over the III-nitride semiconductor region and between the first terminal and the second terminal;
 a stand-by signal generation circuit configured to generate a stand-by signal when the input switching signal to the control terminal has not been detected for a set period of time;
 a voltage regulator circuit configured to provide at least a low power consumption output and a high power consumption output, wherein the low power consumption output is enabled at least during the stand-by mode of operation and the high power consumption output is disabled by the stand-by signal during the stand-by mode of operation;
 a rail voltage terminal configured to provide an input to the voltage regulator circuit; and an under voltage lock out circuit configured to generate an under voltage condition signal when an input voltage signal drops below a threshold value;

wherein the heterojunction device is configured to disconnect the control signal from the gate terminal of the active heterojunction transistor upon a detection of the under voltage condition signal; and wherein the low power consumption output is provided to the stand-by signal generation circuit to thereby power up the stand-by signal generation circuit.

In implementations, the UVLO may be configured to receive an input voltage signal.

The UVLO may comprise a potential divider, wherein a midpoint of the potential divider is configured to provide a voltage signal which divides the input voltage signal according to the ratio of resistors in the potential divider. A resistive ratio of the potential divider may be configured to depend on whether the under voltage condition signal transitions from a low to high value or a high to low value.

Optionally, the UVLO may comprise a capacitor, and the heterojunction device may be configured to charge the capacitor when the divided input voltage signal is above a threshold level and discharge the capacitor when the divided input voltage signal is below the threshold level. In further implementations, the UVLO may be configured to provide a first output when the capacitor charge is above a threshold level and a second output when the capacitor charge is below the threshold level.

In an implementation, the UVLO may be configured for use with a heterojunction device comprising:

a rail voltage terminal; and a voltage regulator circuit, wherein the rail voltage terminal is configured as an input terminal of the voltage regulator block;

wherein the voltage regulator is configured to receive under voltage condition signal as an input signal, and wherein the voltage regulator is configured to operate in a low power consumption mode or a high power consumption mode based on under voltage condition signal.

BRIEF DESCRIPTION OF THE DRAWINGS

The present disclosure will be understood more fully from the accompanying drawings, which however, should not be taken to limit the disclosure to the specific embodiments shown, but are provided for aiding in explanation and understanding only.

DETAILED DESCRIPTION OF THE PREFERRED EMBODIMENTS

Figure 1:
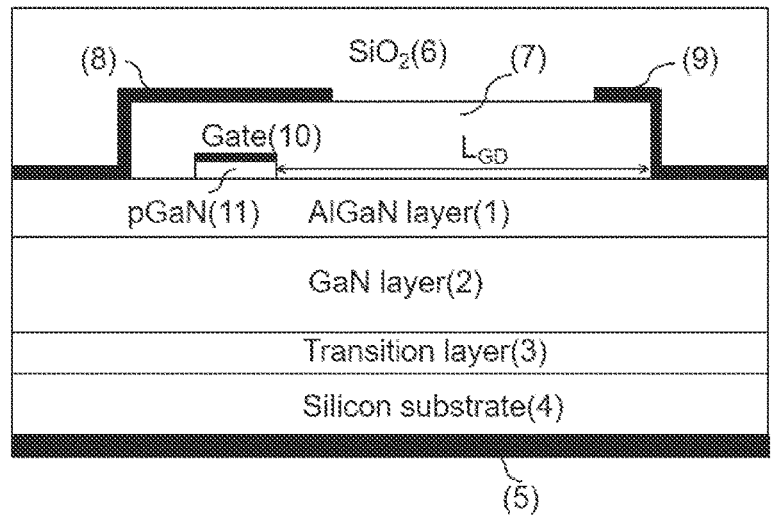
FIG. 1 depicts schematically a GaN high electron mobility transistor.

FIG. 1 shows schematically a GaN high electron mobility transistor which may be used as the power semiconductor device in the power integrated circuit (IC) according to implementations of the present disclosure. FIG. 1 shows a cross section of the active area of a pGaN HEMT. The device includes an AlGaN layer 1, a GaN layer 2, a transition layer 3, a silicon substrate 4, a substrate terminal 5, a SiO$_2$ passivation 6, a source terminal 8, a drain terminal 9, a gate terminal 10, and a highly p-doped GaN cap 11. The source and drain terminal are separated by a surface passivation dielectric layer 7. The device shown is a lateral three-terminal device with an AlGaN/GaN heterostructure grown epitaxially on a standard silicon wafer.

Figure 2:
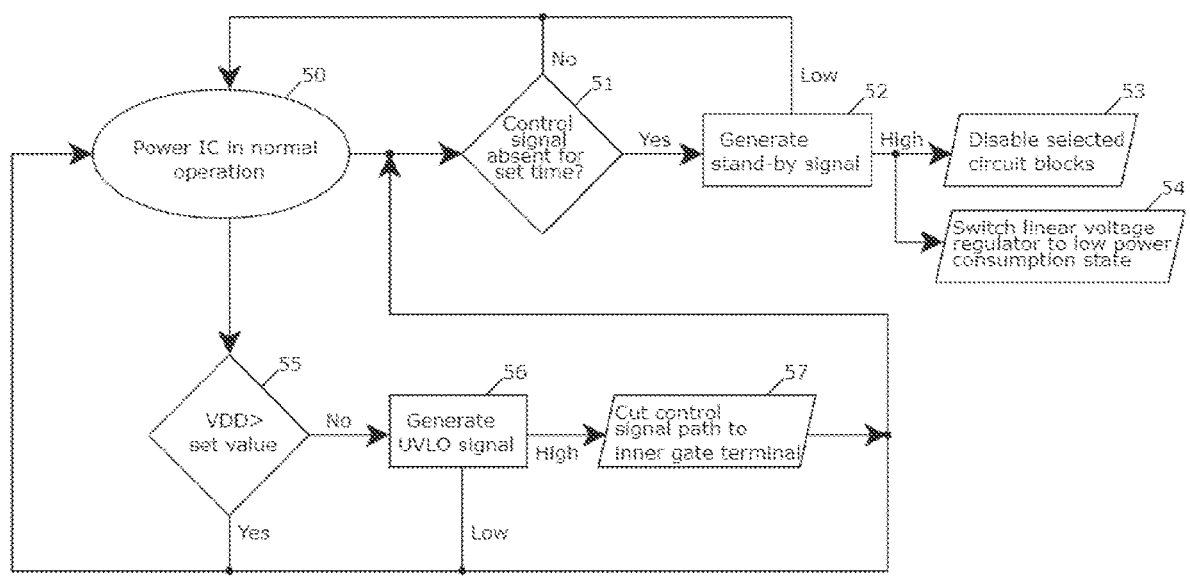
FIG. 2 depicts a flow diagram showing example operations of a power integrated circuit.

FIG. 2 shows a flow chart of an operation of the power integrated circuit according to an implementation of the present disclosure. The power integrated circuit is initially operating in a 'normal' operation in step 50, where normal operation conditions are defined as a load being connected to the power electronic circuit and the power semiconductor device with the integrated circuit operating in a commutation mode.

Two conditions of the circuit are checked during normal operation. One condition is whether the input control signal (also called a control switching signal or an input switching signal) is absent for a set period of time, and this is determined in step 51. If the controller/gate driver stops providing the control signal to the power integrated circuit (as determined by an absence of the input control signal in step 51), then a high stand-by signal is generated in step 52. The high stand-by signal is used to disable selected circuit blocks (step 53) as well to adjust the mode of operation of the linear voltage regulator, from a high power consumption mode to a low power consumption (step 54).

A second condition that is checked in step 55 is whether the input voltage signal, VDD, is higher than a given set value. If the input voltage signal drops below a certain set value, then a UVLO detection signal is generated at step 56.

The high UVLO detection signal is used to disable the path from the external control signal to the inner gate terminal of the power semiconductor device in step 57.

Figure 3:
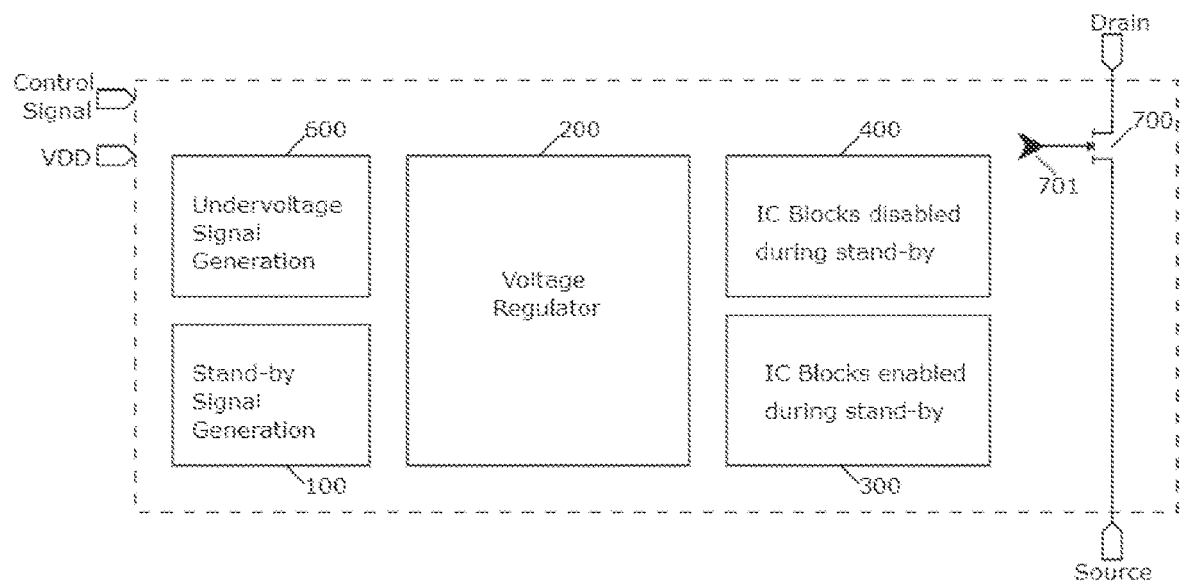
FIG. 3 depicts a block diagram of example circuit blocks comprising a power integrated circuit.

FIG. 3 shows a block diagram of the circuit blocks which comprise the proposed power IC. This may include a stand-by signal generation circuit 100, an under voltage signal generation circuit 600, a voltage regulator circuit 200, a first set of integrated circuit blocks 300 which are enabled during a stand-by mode, a second set of integrated circuit blocks 400 which are disabled during a stand-by mode, and a power enhancement mode HEMT 700. Examples of integrated circuit blocks which may be used in the power integrated circuit include but are not limited to an integrated gate driver, an auxiliary gate (such as the auxiliary gate described in PCT publication No. WO2020/225362), a Miller clamp, a current sense circuit, an over-current protection circuit, a current sense amplifier, a temperature sense circuit.

The terminals of the power integrated circuit may comprise a drain terminal, a source terminal, a control terminal (for receiving a control signal) and a terminal for an input voltage signal VDD. Additional input and/or output terminals may be incorporated based on the needs of the integrated circuit blocks included in a given power IC. The gate terminal 701 of the power enhancement mode HEMT 700 may be connected internally to the integrated circuit blocks 300 and 400 and/or directly to the control terminal.

The control terminal and the gate terminal 701 of the enhancement mode power HEMT may be connected directly or they may be indirectly connected, for example through a gate driver or an auxiliary gate (such as the auxiliary gate described in PCT publication No. WO2020/225362).

Figure 4:
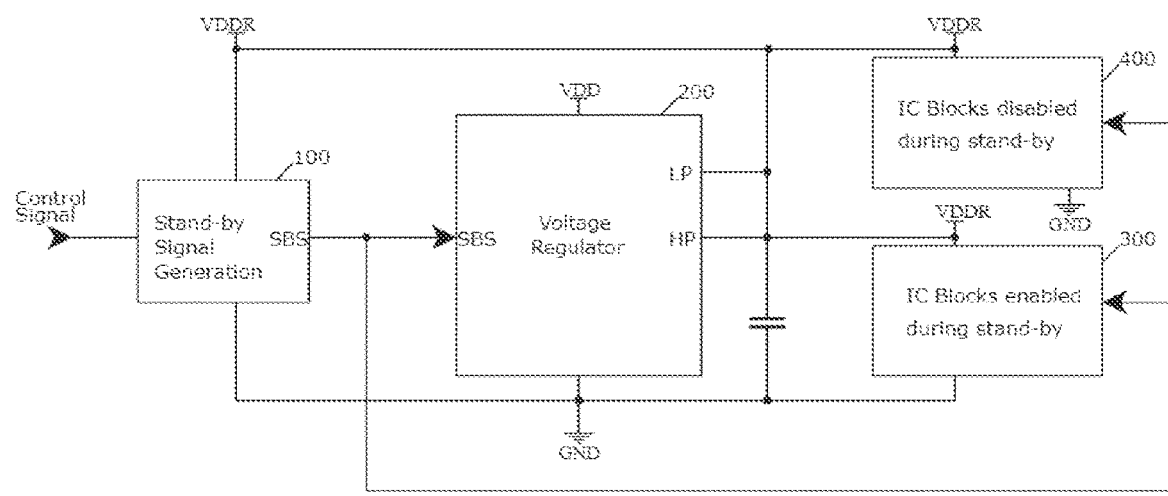
FIG. 4 depicts a schematic block diagram of an example power integrated circuit.

FIG. 4 shows a circuit schematic block of one implementation of the present disclosure. The circuit schematic block in this example comprises four blocks: a stand-by signal generation circuit 100, a linear voltage regulator 200, a first group of circuit blocks 300 which are operational during a stand-by mode and a second group of circuit blocks 400 which are disabled during stand-by mode. A power HEMT may also be provided, but is not included in this schematic in order to improve the clarity of the figure.

The linear voltage regulator receives an input voltage signal, VDD (e.g. 20V) and provides a regulated voltage supply for the chip VDDR (e.g. 6V). In this embodiment, the regulated supply is used to power the different integrated circuit blocks of the chip including the stand-by signal generation circuit.

The stand-by signal generation circuit receives the control signal (or a conditioned version of the control signal) as an input. In power electronics circuits the control signal may be, for example, a pulse width modulation (PWM) signal from a gate driver or a controller. If the control signal is absent for a predetermined or set amount of time, the stand-by signal generation circuit generates a high stand-by signal which is passed on to the linear voltage regulator and is used to switch between high and low power consumption modes. The stand-by signal is also passed to the groups of integrated circuit blocks 400 which are disabled during a stand-by condition, such that the blocks may be enabled or disabled based on the stand-by signal.

Figure 5:
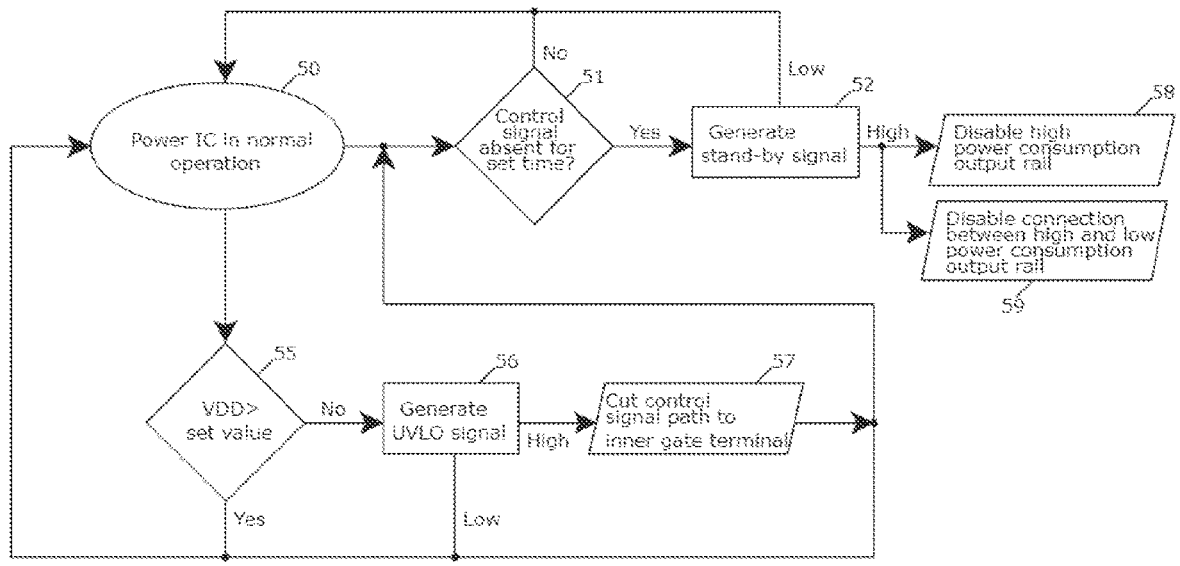
FIG. 5 depicts a flow diagram showing example operations of a power integrated circuit.

FIG. 5 shows a flow chart of an example operation of a power integrated circuit according to the present disclosure. The flow chart is similar to the flow chart presented in FIG. 2. The difference compared to FIG. 2, is in the manner that the high stand-by signal is used once it is generated. In the operation of FIG. 5, the high stand-by signal is used to disable the high power consumption output rail of the voltage regulator (step 58) and to disable the connection between the high power consumption output rail and the low power consumption output rail (step 59).

Figure 6:
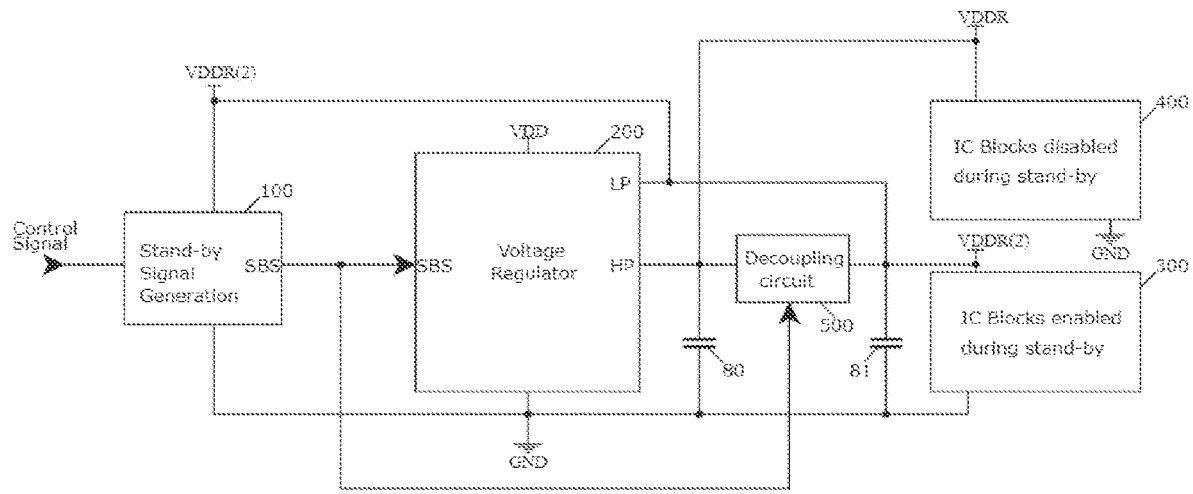
FIG. 6 depicts a schematic block diagram of a second example power integrated circuit.

FIG. 6 shows a circuit schematic block of another implementation of the present disclosure. As in FIG. 4, this circuit schematic block also comprises four blocks: a stand-by signal generation circuit 100, a linear voltage regulator 200, a first group of circuit blocks 300 which are operational during a stand-by mode and a second group of circuit blocks 400 which are disabled during a stand-by mode.

In addition to these circuit blocks, the embodiment of FIG. 6 comprises an additional circuit block, the decoupling circuit 500, and capacitors 80, 81. In this embodiment, the high power consumption output rail is connected as an input to the decoupling circuit, while the low power consumption output rail is connected at the output of the decoupling circuit.

The integrated circuit blocks 400 are directly connected to the high power consumption output rail VDDR. The stand-by signal generation circuit and integrated circuit blocks 300 are directly connected to the low power consumption output rail VDDR(2).

During certain modes of operation, the integrated circuit blocks 300 may be connected to the high power consumption output rail VDDR through the decoupling circuit 500. In operation, the decoupling circuit 500 may serve two functions. One function is to decouple any high frequency signals from VDDR to VDDR(2). This function is useful during normal operation of the integrated circuit where VDDR is configured to supply power to VDDR(2). A second function is to disconnect VDDR from VDDR(2) when a high stand-by signal is generated. During this mode of operation (i.e. during stand-by mode or operation under a no load condition), the voltage regulator supplying the high power consumption output rail is disabled and the capacitor connected to VDDR will discharge to zero. The decoupling circuit prevents (by disconnecting VDDR(2) from VDDR during stand-by), or otherwise minimises as far as possible, any loss of charge from VDDR(2) to VDDR. VDDR(2) remains at a regulated voltage as it is charged by the low power consumption output rail, which is not disabled during the stand-by mode.

Therefore, during a stand-by operation mode, integrated circuit blocks 300 remain powered by VDDR(2), while integrated circuit blocks 400 are no longer powered by VDDR, which discharges to zero. This enables a reduction in the overall power consumption in the integrated circuit during a stand-by mode compared to the overall power consumption in the integrated circuit during a normal operation.

Figure 7:
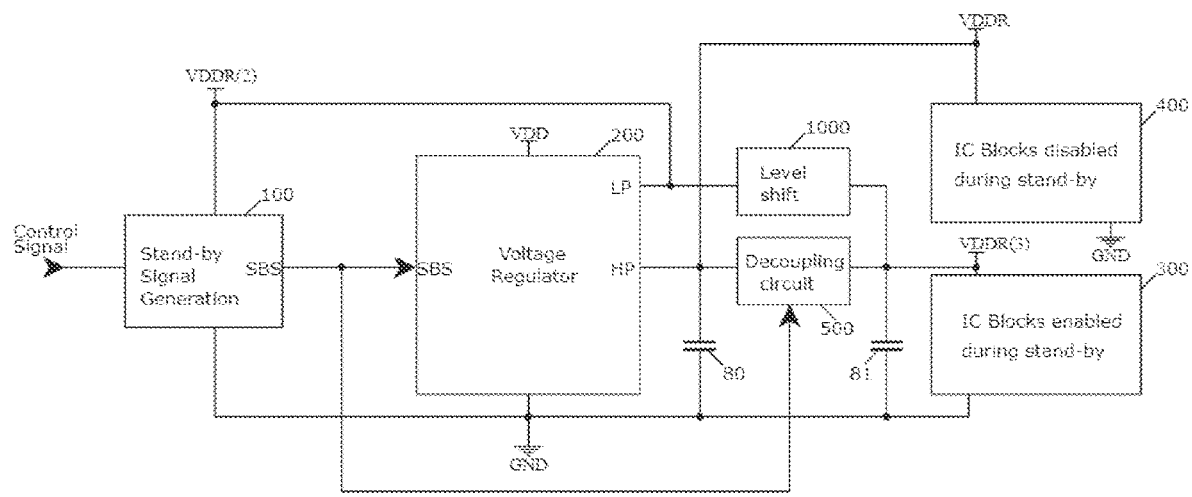
FIG. 7 depicts a schematic block diagram of a third example power integrated circuit.

FIG. 7 shows a circuit schematic block of another implementation of the present disclosure. As in FIG. 6, this circuit schematic block also comprises five blocks: a stand-by signal generation circuit 100, a linear voltage regulator 200, a first group of circuit blocks 300 which are operational during a stand-by mode, a second group of circuit blocks 400 which are disabled during a stand-by mode, and a decoupling circuit 500.

Figure 8:
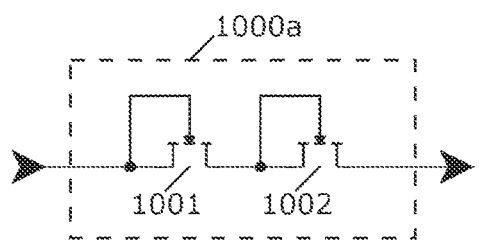
FIG. 8 depicts a circuit diagram of an example level shift circuit.

In addition to these circuit blocks, this embodiment comprises an additional circuit block, the level shift circuit 1000. In this embodiment, the high power consumption output rail VDDR is connected as an input to the decoupling circuit 500, while the low power consumption output rail VDDR(2) is connected through the level shift circuit 1000 at the output of the decoupling circuit 500. The level shift circuit 1000 may comprise one or more (e.g. several) level shifting source-gate connected HEMTs 1001, 1002, which may be connected in series (as illustrated in level shift circuit 1000a of FIG. 8). In other examples, the level shift circuit may comprise diodes or a HEMT with a fixed gate bias (not shown).

As in FIG. 6, the integrated circuit blocks 400 are directly connected to the high power consumption output rail VDDR. The stand-by signal generation circuit is directly connected to the low power consumption output rail VDDR (2). The integrated circuit blocks 300 are connected to the level shifted low power consumption output rail VDDR(3) through the level shift circuit 1000.

During certain modes of operation, the integrated circuit blocks 300 may be connected to the high power consumption output rail VDDR through the decoupling circuit 500. In operation, the decoupling circuit 500 may serve two functions. One function is to decouple any high frequency signals from VDDR to VDDR(3). This function is useful during normal operation of the integrated circuit where VDDR is configured to supply power to VDDR(3). A second function is to disconnect VDDR from VDDR(3) when a high stand-by signal is generated. During this mode of operation (i.e. during stand-by mode or operation under a no load condition), the voltage regulator supplying the high power consumption output rail is disabled and the capacitor connected to VDDR will discharge to zero. The decoupling circuit prevents (by disconnecting VDDR(3) from VDDR during stand-by), or otherwise minimises as far as possible, any loss of charge from VDDR(3) to VDDR. VDDR(3) remains at a regulated voltage as it is charged by the low power consumption output rail, which is not disabled during the stand-by mode.

Therefore, during a stand-by operation mode, integrated circuit blocks 300 remain powered by VDDR(3), while integrated circuit blocks 400 are no longer powered by VDDR, which discharges to zero. This enables a reduction in the overall power consumption in the integrated circuit during a stand-by mode compared to the overall power consumption in the integrated circuit during a normal operation.

Figure 9:
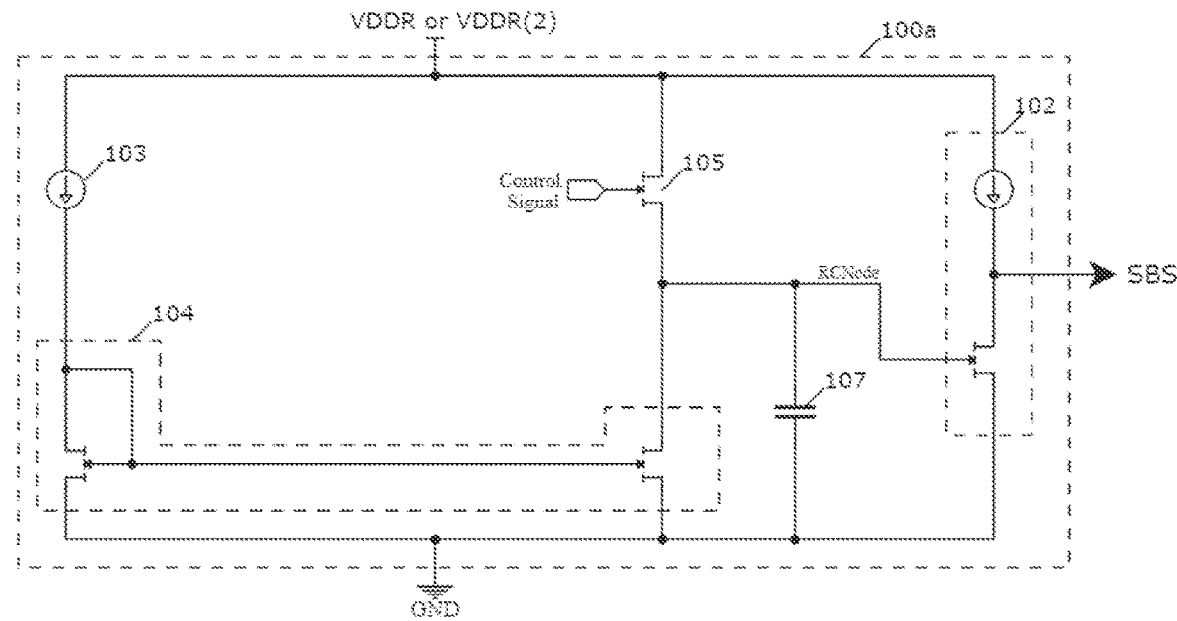
FIG. 9 depicts a circuit diagram of an example stand-by signal generation circuit.

FIG. 9 shows a circuit schematic of the stand-by signal generation circuit according to an implementation of the present disclosure. The stand-by signal generation circuit may be utilised as the block circuit 100 of e.g. FIGS. 3, 4, 6 and/or 7.

The control signal is applied to the gate of the enhancement mode HEMT 105. When the control signal is high, the RC node is charged through enhancement mode HEMT 105. When the control signal is low, the RC node is discharged through the enhancement mode HEMT in current mirror circuit 104.

The discharge current is set through the current mirror circuit 104. The discharge circuit is designed to provide a discharge path with a greater resistance than the resistance of the charge path, such that when a switching control signal is provided (e.g. at a duty cycle of operation suitable to most power electronic applications) the RC node remains close to fully charged, or at least above the threshold voltage of the enhancement mode HEMT in inverter 102.

Alternatively, when the control signal is absent or otherwise continuously low for significant periods of time, the RC node is gradually discharged. The time required for the RC node to discharge below the threshold voltage of the enhancement mode HEMT in inverter 102 may be controlled by the current set by the current mirror 104 and/or the size of capacitor 107. When the RC node drops below the threshold voltage of enhancement mode HEMT in inverter 102, the HEMT can turn-off and the output of the stand-by signal generation circuit is pulled up by the current source.

Figure 10:
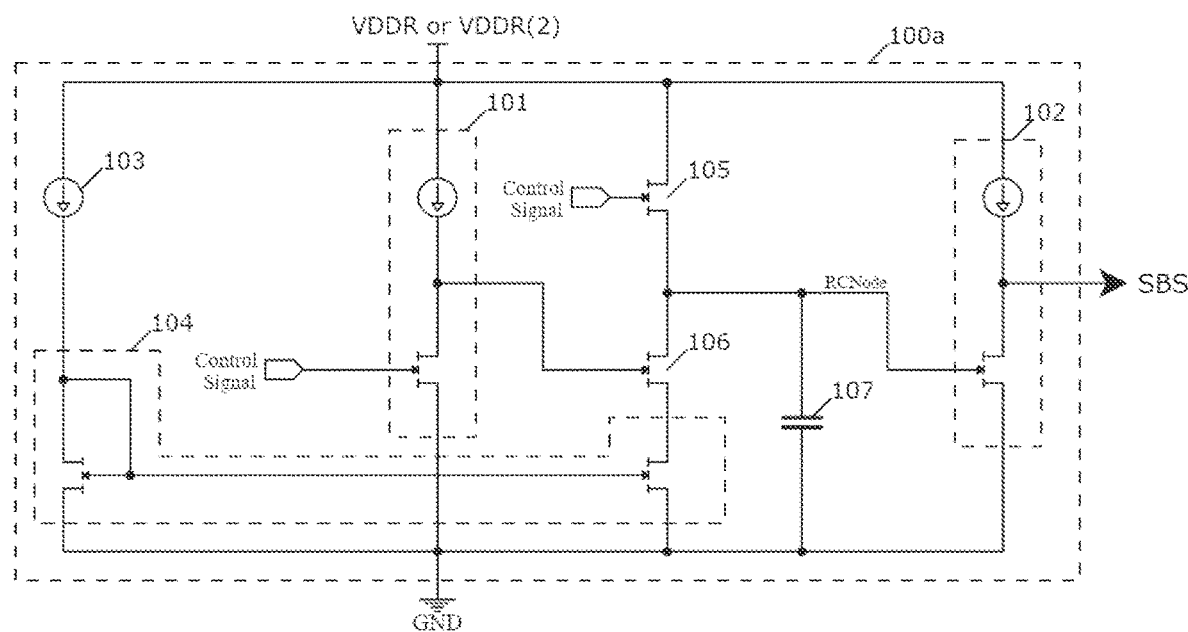
FIG. 10 depicts a circuit diagram of a second example of a stand-by signal generation circuit.

FIG. 10 shows a circuit schematic of the stand-by signal generation circuit according to an implementation of the present disclosure. The stand-by signal generation circuit may be utilised as the block circuit 100 of FIGS. 3, 4, 6 and/or 7. The circuit off FIG. 10 is similar to that of FIG. 9, but additionally comprises an inverter 101 and an enhancement mode HEMT 106.

In this example, the control signal is applied to the gates of the enhancement mode HEMT in inverter 101 and the enhancement mode HEMT 105. The output of the inverter 101 contains an inverted control signal, and is connected to the gate terminal of an internal inverted enhancement mode HEMT 106. When the control signal is high, the RC node is charged through enhancement mode HEMT 105. When the control signal is low, the RC node is discharged through enhancement mode HEMT 106.

The discharge current is set through the current mirroring circuit 104. The discharge circuit is designed to provide a discharge path with a greater resistance than the resistance of the charge path, such that when a switching control signal is provided (e.g. at a duty cycle of operation suitable to most power electronic applications) the RC node remains close to fully charged, or at least above the threshold voltage of the enhancement mode HEMT in inverter 102.

Alternatively, when the control signal is absent or otherwise continuously low for significant periods of time, the RC node is gradually discharged. The time required for the RC node to discharge below the threshold voltage of the enhancement mode HEMT in inverter 102 mat be controlled by the current set by the current mirror 104 and the size of capacitor 107. When the RC node drops below the threshold voltage of enhancement mode HEMT in inverter 102, the HEMT can turn-off and the output of the stand-by signal generation circuit is pulled up by the current source.

Figure 11:
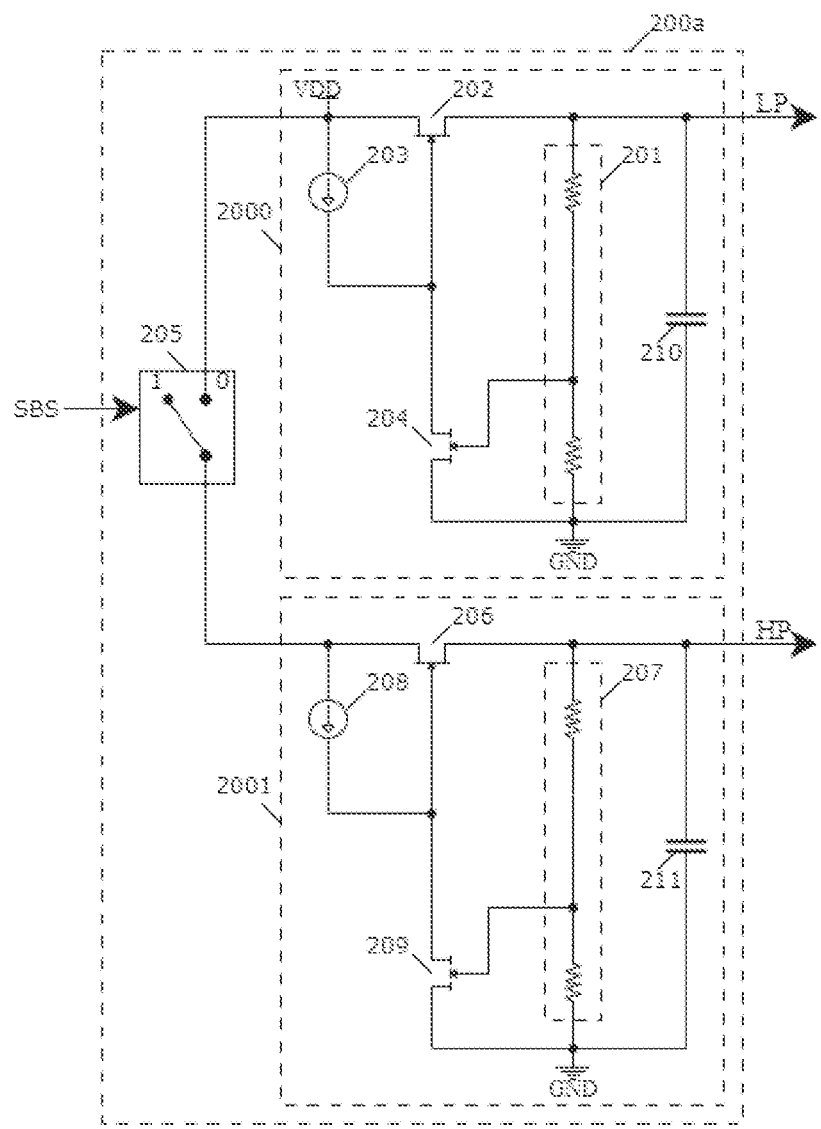
FIG. 11 depicts a circuit diagram of an example linear voltage regulator.

FIG. 11 shows a circuit schematic of an implementation of a linear voltage regulator 200a. Linear voltage regulator 200a comprises two outputs, a high power consumption output rail (HP) and a low power consumption output rail (LP). The two outputs are provided by two internal circuits—circuit 2000 for the low power consumption output rail, and circuit 2001 for the high power consumption output rail.

Circuit 2000 comprises a current source 203, a series depletion mode HEMT 202 and an enhancement mode HEMT 204 controlled by the midpoint of a potential divider 201, and an output capacitor 210. The power consumption of circuit 2000 is controlled by the size of the current source 203 and the size of the resistors in the potential divider. The size of the current source 203 however may also control the current that can be drawn from the linear regulator 200a before the regulated supply starts to drop, as well as the time it takes to charge back up to the regulated voltage if the regulated supply drops. As such, the higher the power consumption of circuit 2000, the more loads can be supported by the low power consumption output rail.

Circuit 2000 is designed to have low power consumption as it remains operational during a no-load condition, such as when the device is in a stand-by mode. This low power consumption assists in meeting no-load condition power dissipation requirements. Maintaining the low power consumption output rail (LP) during a stand-by mode is therefore desirable for circuits which are needed or otherwise useful in stand-by operations, including and for example the stand-by signal generation circuit itself.

Circuit 2001 comprises a current source 208, a series depletion mode HEMT 206 and an enhancement mode HEMT 209 controlled by the midpoint of a potential divider 207, and an output capacitor 211. Circuit 2001 is intended to operate during normal operation and may be designed according to the principles outlined above for circuit 2000. During normal operation, circuit 2001 may be afforded a higher power consumption to be able to support the integrated circuit blocks connected to the regulated supply HP. As such, the stand-by signal may be used to disconnect circuit 2001 when a stand-by condition is detected (i.e. the stand-by signal, SBS is high or otherwise e.g. above a threshold level) in order to minimise the power dissipation during the stand-by mode. This operation is illustrated by switch 205, which is configured to receive the signal SBS as a control signal, connect circuit 2001 when the signal SBS is low and dis-connect circuit 2001 when the signal SBS is high.

Figure 12:
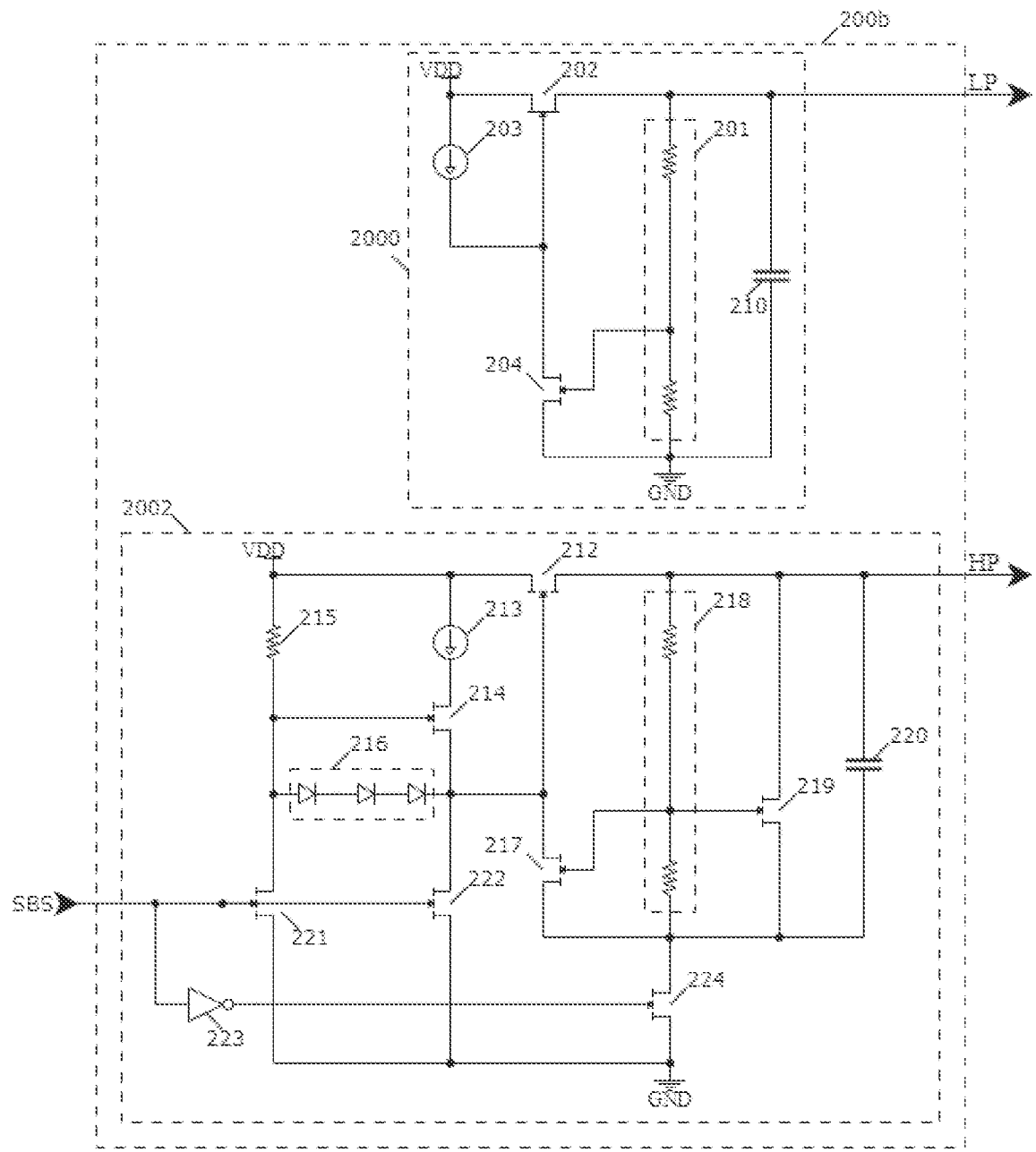
FIG. 12 depicts a circuit diagram of a second example linear voltage regulator.

FIG. 12 shows a circuit schematic of a further implementation of a linear voltage regulator 200b. Linear voltage regulator 200b also comprises two outputs, a high power consumption output (HP) and a low power consumption output (LP), with the outputs again provided by two internal circuits—circuit 2000 for the low power consumption output, and circuit 2002 for the high power consumption output. Circuit 2000 may be identical to the corresponding circuit 2000 shown in FIG. 11.

In voltage regulator 200b, the stand-by signal is provided as an input to circuit 2002 and acts to disable the circuit when a high stand-by signal is detected. Therefore, similar to voltage regulator 200a, the change from the high-power mode to the low-power mode occurs when a (sufficiently high) stand-by signal is detected. In voltage regulator 200b, the stand-by signal is applied to the gate terminal of enhancement mode HEMTs 221, 222 and 224, such that when the stand-by signal is low the enhancement mode transistors are off and when the stand-by signal is high the enhancement mode transistors are on.

When the stand-by signal is low, power is dissipated through the current source path 213. The current source level may be set at a suitable level for the linear voltage regulator 200b to support any loads connected to its output during normal operation according to the principles described above. However, the current source level may lead to undesirably or unacceptably high power consumption during stand-by operations. Thus, when the stand-by signal is detected (i.e. SBS signal is sufficiently high), the current source path no longer draws any current, and during a stand-by mode of operation power is only provided by the low power consumption output circuit 2000.

The size of resistor 215 sets the magnitude of the undesirable power dissipation in circuit 2002 when the stand-by signal is high (i.e. when the integrated circuit is in stand-by mode or when the system is operating under a no-load condition). As such, resistor 215 may be selected to keep the power dissipation during this condition within the required specifications for the intended use.

Figure 13:
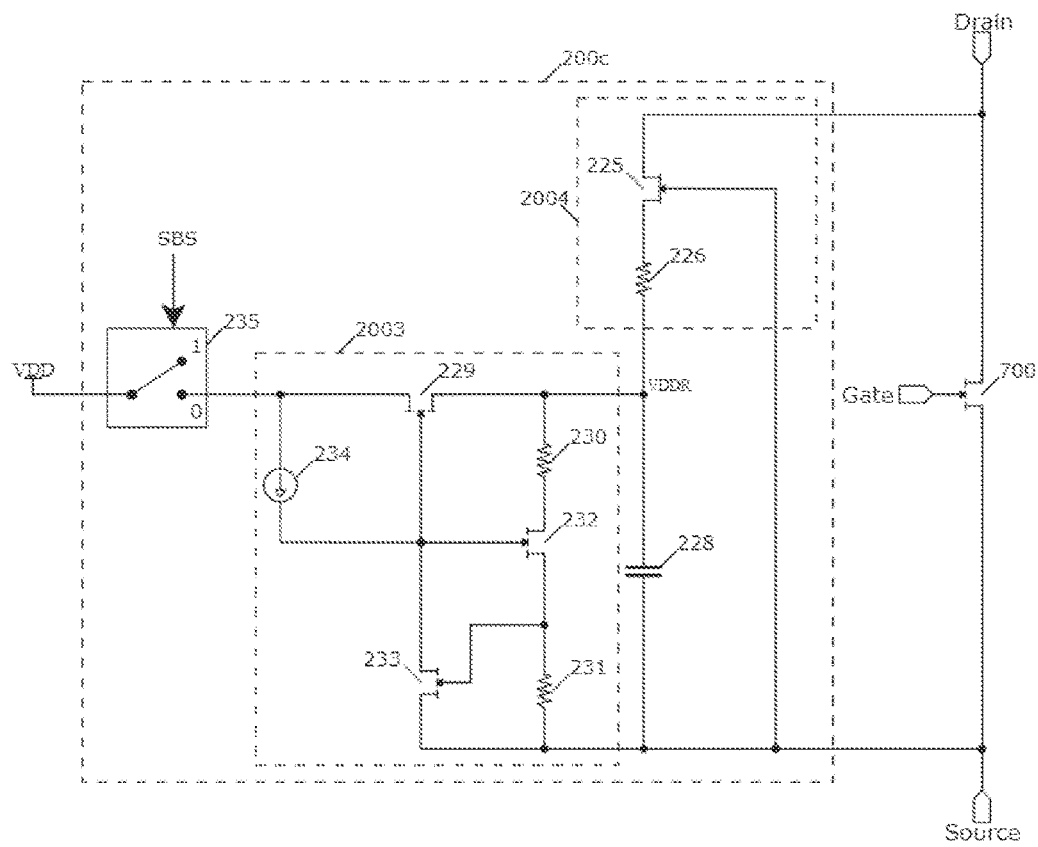
FIG. 13 depicts a circuit diagram of a third example linear voltage regulator.

FIG. 13 shows a circuit schematic of another further implementation of a linear voltage regulator 200c which can change between a high power dissipation mode and a low power dissipation mode. In voltage regulator 200c, a circuit 2003 (similar to the circuit 2001 in FIG. 11 of voltage regulator 200a) is in operation during normal operation of the power chip or other power device comprising voltage regulator 200c.

When the stand-by signal is detected (i.e. is sufficiently high), circuit 2003 is disconnected using circuit block 235. Voltage regulator 200c also comprises a second circuit 2004 which can supply a regulated output voltage rail VDDR. This circuit 2004 comprises a high voltage depletion mode HEMT 225 which draws current from the high voltage drain node Vdrain. The source of the depletion mode HEMT 225 is connected to the regulator output node, and the gate of the depletion mode HEMT 225 is connected to the source of the power HEMT. A resistor 226 may be connected in series with the source of the HEMT 225 as shown to control the maximum allowable current.

When circuit 2003 is connected during normal operation the output of the linear voltage regulator 200c may be designed to be at a value which is greater than the threshold voltage of the depletion mode HEMT 225. In this condition, the gate-source voltage Vgs for the depletion mode HEMT 225 is more negative than its threshold voltage and therefore the depletion mode HEMT 225 is in the off-state and can draw negligible current. When the stand-by signal is detected and circuit 2003 is disconnected, the output of the linear voltage regulator will drop until it reaches a value which is equal to the threshold value of the depletion mode HEMT 225. In this condition, the depletion mode HEMT 225 will be in saturation and current can be drawn from the high voltage supply to power any connected circuit blocks which are desired to remain operational during a stand-by mode. As the current is drawn from the high voltage supply, the load connected during the stand-by mode draws very little current such that the power dissipation during the stand-by mode remains within the required limits.

The depletion mode HEMTs of the voltage regulators 200a, b and c may have a Schottky gate, and/or may have a p-GaN island gate such as that as described in U.S. patent Ser. No. 11/081,578.

The drain of the depletion mode HEMT 225 may be provided as an additional external terminal, rather than be connected to the drain of enhancement mode HEMT 700. Enhancement mode HEMT 700 is intended in this schematic to be illustrative of the high voltage transistor. The regulated voltage VDDR may power other integrated circuit circuits on the chip (not shown) such as a current sense amplifier, Miller clamp circuit, UVLO circuit etc., and/or a stand-by signal generation circuit such as that shown in e.g. FIGS. 9 and 10.

As discussed above in relation to FIGS. 2 and 5, in addition to or instead of stand-by detection, the power integrated circuit may also be designed to check for a second condition—whether the input voltage signal VDD is above a minimum required set value. If the input voltage signal drops below the minimum required input voltage signal, then an under voltage lockout (UVLO) signal may be generated.

Figure 14:
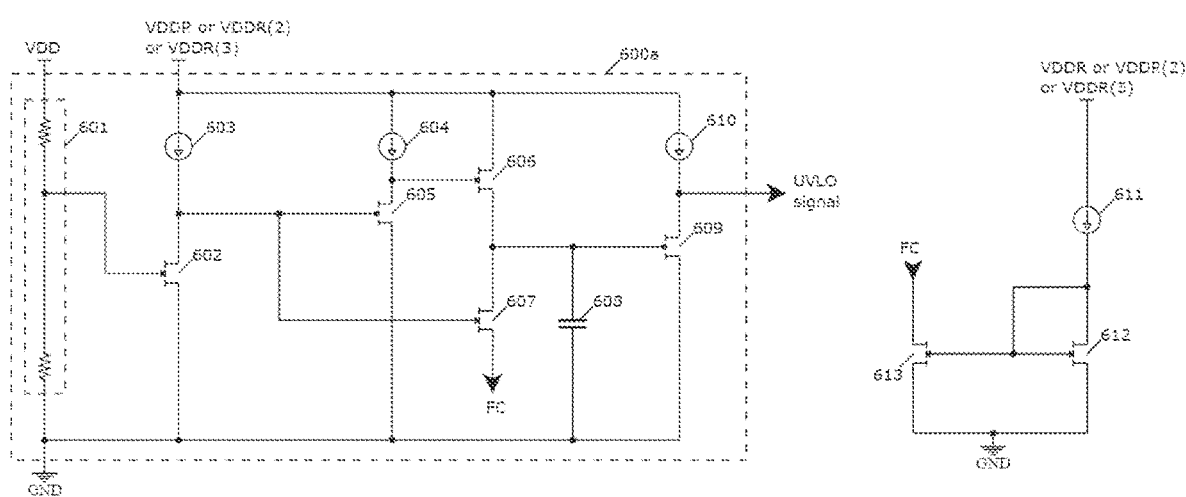
FIG. 14 depicts a circuit diagram of an example UVLO signal generating circuit.

FIG. 14 shows an implementation of an under voltage lockout circuit 600a which can generate a UVLO signal. The midpoint of the potential divider 601 tracks the input voltage signal VDD and is connected to an inverter 602, 603. The output of the inverter 602, 603 then drives additional enhancement mode HEMTs 605, 607 such that when VDD is greater than the set value, capacitor 608 is charged through transistor 606, and when VDD is less than the set value, capacitor 608 is discharged through transistor 607.

The capacitor is connected to the input of a second inverter 609, 610 such that when the capacitor is charged the output signal of the UVLO circuit 600a is low, and when the capacitor is discharged the output signal of the UVLO circuit 600a is high. The UVLO output signal can be used to dis-connect a control signal from a gate terminal of a high voltage transistor. Additionally the UVLO signal may also be used to change a voltage regulator such as voltage regulators 200*a, b* and *c* from a high power consumption mode to a low power consumption mode, as previous described.

The discharge current through transistor 607 can be set using the current mirroring circuit 611, 612, 613. Circuit 600*a* may further be designed to offer some filtering of high frequency signals on the VDD input such that the UVLO signal is not triggered if the VDD signal drops for only short periods of time, for example by including additional high frequency filtering components connected to the VDD input.

Figure 15:
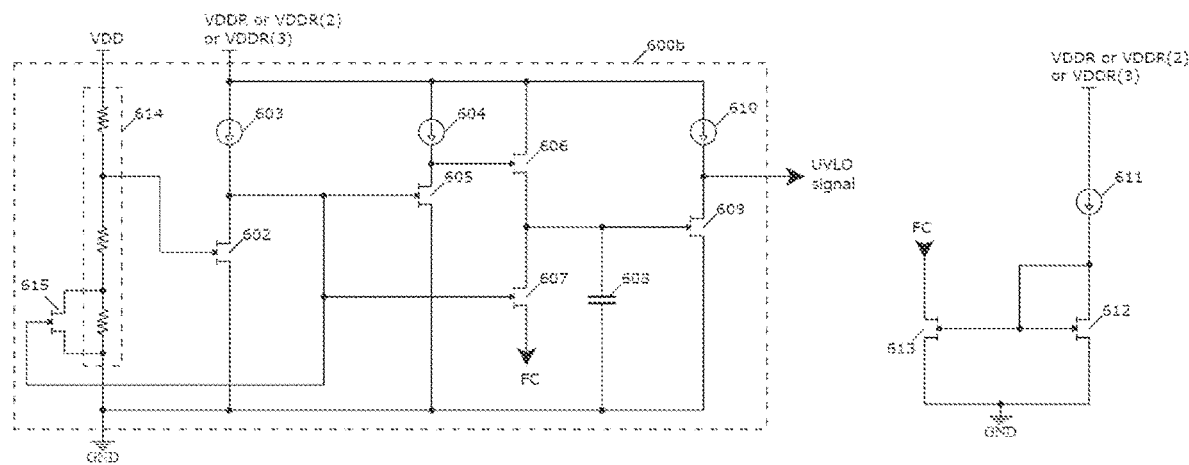
FIG. 15 depicts a circuit diagram of a second example UVLO signal generating circuit.

The UVLO circuit may have some hysteresis as shown in UVLO circuit 600*b* of FIG. 15. Hysteresis is implemented by including an additional enhancement mode HEMT 615 in the circuit, which can change the potential divider 614 resistive ratio depending on whether the UVLO signal transition is from low to high or high to low.

Figure 16:
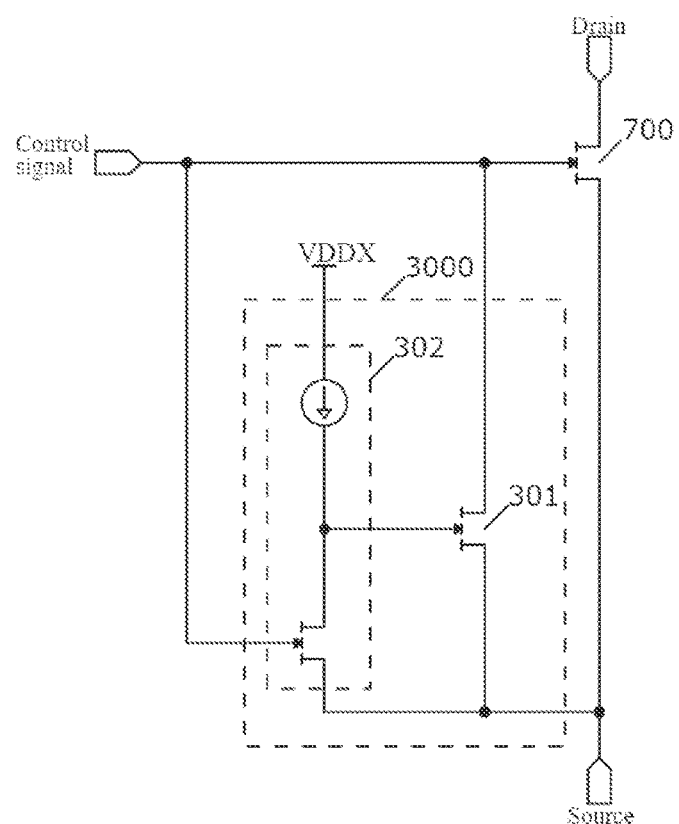
FIG. 16 depicts a circuit diagram of an example integrated circuit block.

FIG. 16 shows an example implementation of an integrated circuit block 3000 to be enabled during a stand-by mode, for example by being connected to the low power consumption output rail (or level shifted low power consumption output rail), as previous described. The integrated circuit block 3000 is illustrated as being powered by voltage rail VDDX. For example, VDDX may be VDDR if circuit block 3000 is used in the circuit illustrated in FIG. 4 and FIG. 13. VDDX may be VDDR (2) if circuit block 3000 is used in the circuit illustrated in FIG. 6. VDDX may be VDDR (3) if circuit block 3000 is used in the circuit illustrated in FIG. 7. This circuit block 3000 comprises an inverter 302 and a Miller clamp transistor 301. The inverter 302 may receive the control signal as an input or a conditioned version of the control signal. This may also be the case for the gate terminal of the enhancement mode HEMT 700. It may be desirable to maintain the operation of the Miller clamp 301 during a stand-by mode so as to protect power HEMT 700 and the overall system, for example when the power integrated circuit is used from fast dV/dt transients. During the stand-by mode the control signal is low and therefore the output of inverter 302 is high. In this condition the Miller clamp transistor 301 is on and as a result the source and gate terminal of HEMT 700 may be connected through a low resistance path. This path provides some immunity to fast dV/dt transients which may create a false turn-on of the power HEMT.

Figure 17:
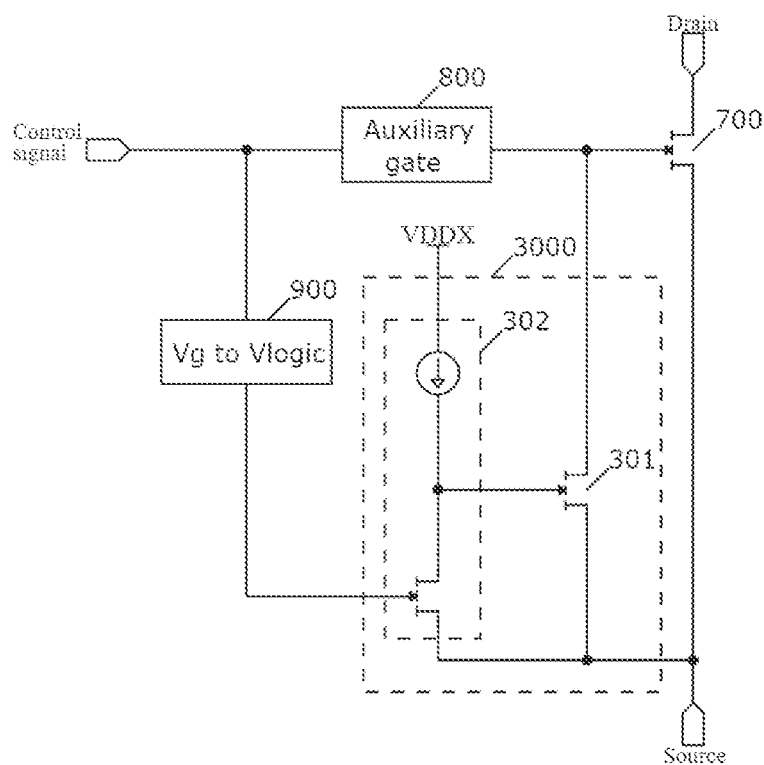
FIG. 17 depicts schematically a block circuit diagram of an example integrated circuit.

FIG. 17 shows another example implementation of an integrated circuit block 3000. In circuit block 3000, the inverter 302 receives an input signal indirectly from the control signal. The switching control signal may be stepped down (or up) in magnitude using a further circuit block 900, according to the requirements of the input of inverter 302. Similarly, the switching control signal may be conditioned using an auxiliary gate circuit block 800, before being applied to the gate terminal of enhancement mode power transistor 700. In one example the auxiliary gate circuit block 800 may function as described in U.S. patent application Ser. No. 17/350,490 and published as US2021/0335781 A1.

Figure 18:
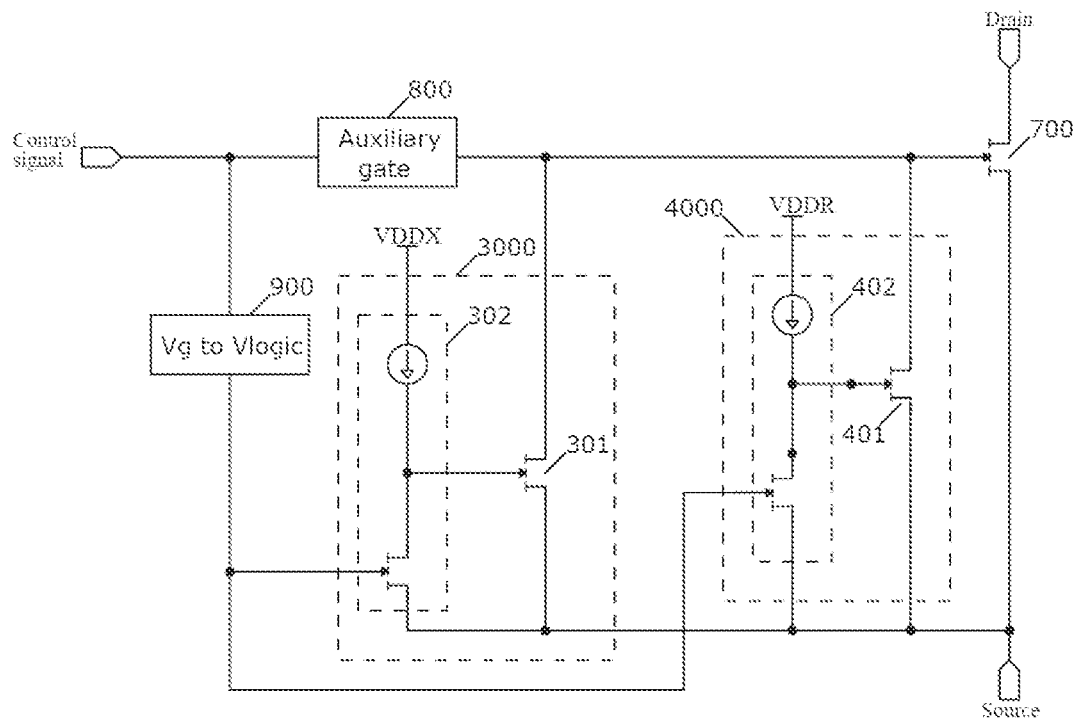
FIG. 18 depicts schematically a block circuit diagram of a second example integrated circuit.

FIG. 18 shows a further example implementation of an integrated circuit. This Figure depicts an example of a circuit block 4000 which may be disabled during a stand-by operation, for example by being connected to the high power consumption output rail VDDR, as previous described. This circuit block 4000 comprises an inverter 402 and a Miller clamp transistor 401. Circuit block 4000 may operate in a similar manner to circuit block 3000, as previously described. However, circuit block 4000 is designed to be active during only the switching operation of the main power device 700, and not during a stand-by mode. This means that the transistors inside the block 4000 are designed to enable effective and fast switching of the main power device 700, and thus the block 4000 may consume more power during operation than block 3000. In other words, the two circuit blocks 3000, 4000 may be designed in a different manner to optimise the trade-off between power dissipation and speed at different modes of operation of the circuit.

As circuit block 4000 is disabled during a stand-by operation, where allowable power dissipation is limited, it may be designed to be faster during 'active' operation. Faster may refer to response time and/or transient time of the circuit. In contrast, the block 3000 remains active during stand-by operation, and the Miller clamp 301 may be in the on-state when the power device 700 is in off-state. Additionally, Miller clamp transistor 401 may be designed to be larger in size (i.e. have a lower resistance) than miller clamp transistor 301. This may offer better immunity to dV/dt transients during 'normal' operations to prevent or reduce false turn-on events of the power HEMT 700. The Miller clamp transistor 301 may have a larger on-state resistance than the on-state resistance of the Miller clamp 401.

Figure 19:
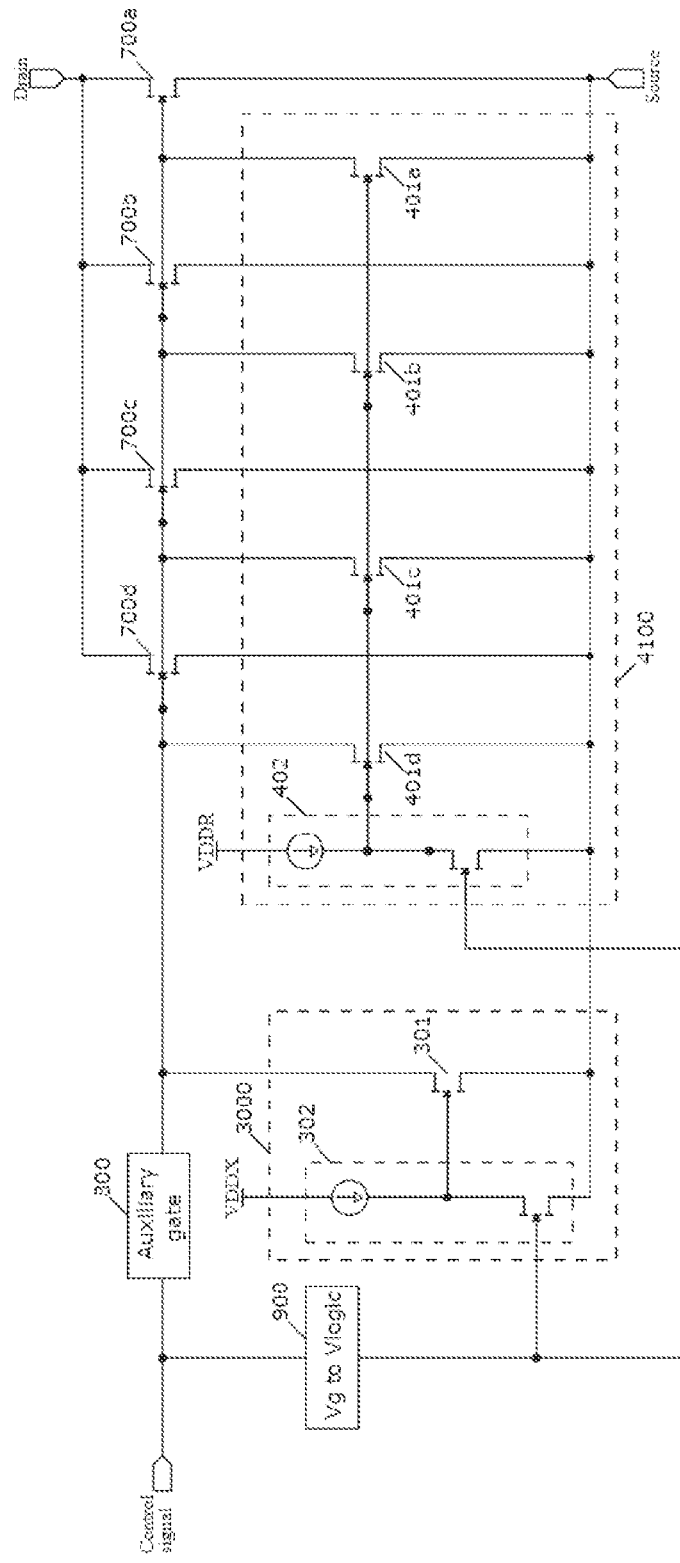
FIG. 19 depicts schematically a block circuit diagram of a third example integrated circuit.

FIG. 19 shows another example implementation of an integrated circuit. FIG. 19 is similar to FIG. 18, however rather than a single Miller clamp transistor 401, circuit block 4100 comprise a network of multiple distributed Miller clamp sub-transistors 401*a*, 401*b*, 401*c*, 401*d*. The Miller clamps 401*a*, 401*b*, 401*c*, 401*d* are only active during the switching operation of the main power device, which is comprised of parallel sub-HEMTs 700*a, b, c* and *d*. The Miller clamp transistors 401*a*, 401*b*, 401*c*, 401*d* are connected between the gate and source terminal of a distributed network of the power sub-HEMT 700*a*, 700*b*, 700*c* and 700*d*.

The distributed network of Miller clamp transistors may allow for these transistors to be placed in closer proximity to the corresponding power HEMT e.g. 700*a*, 401*a* such that the parasitics in the connections between the power sub-HEMT and its corresponding Miller clamp sub-transistor are minimised. This may improve turn-off speed of the power transistor and improve immunity to dV/dt transients. The Miller clamp sub-transistors may be driven by a single inverter circuit 402. Alternatively, each Miller clamp sub-transistor 401*a*, 401*b*, 401*c*, 401*d* may have its own inverter (not shown).

Circuit block 4100 may be disabled during a stand-by operation, similar to circuit block 4000, and thus may be optimized according to the principles outlined above in relation to FIG. 18. The circuit block 3000 remains active during the stand-by operation (when the power device 700, here comprising multiple parallel transistors HEMT 700*a*, 700*b*, 700*c* and 700*d*, is in the off-state and blocking the voltage between drain and source terminals). The Miller clamp transistor 301 may have a larger on-state resistance than the equivalent parallel on-state resistance of the Miller clamps 401*a*, 401*b*, 401*c*, 401*d*. In another example not illustrated here, each Miller clamp sub-transistor may be driven by a network of distributed inverter sub-circuits, rather than a single inverter circuit 402.

Figure 20:
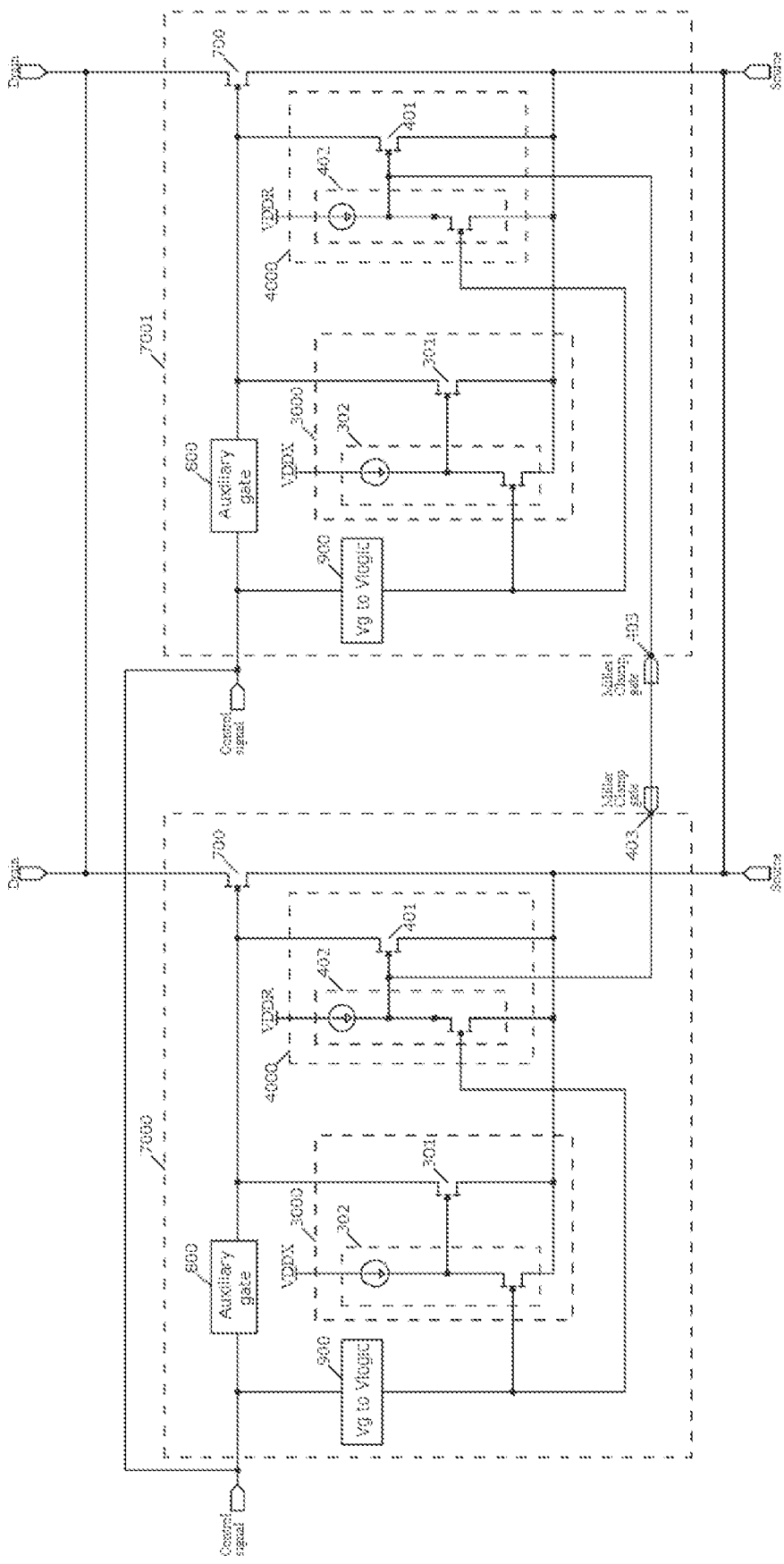
FIG. 20 depicts schematically a block circuit diagram of example parallel power device GaN chips.

FIG. 20 shows parallel power device GaN chips 7000, 7001 where the GaN chips are similar to the circuit illustrated in FIG. 18. In high power applications, it may be desirable to provide more than one chip in parallel. While FIG. 20 shows two GaN chips in parallel, it will be understood that more than two GaN chips may be provided. Each of the chips comprise an auxiliary gate interface 800 and a double Miller clamp (one for stand-by operation 3000 and one for active switching operation 4000). Additional connections may be provided between the internal gate terminals of the active heterojunction transistor 700 (not shown here) or the gates of the active Miller clamps (as extra pins 403), such that when connected in parallel, and when switching, the first Miller clamp that comes on switches all the other main HEMT transistors in the chips 7000, 7001 off. This may be beneficial to avoid delays due to different parasitics within the integrated circuit of each chip for example due to process variation. Additionally, it may be beneficial due to different parasitics due to PCB level routing.

Figure 21:
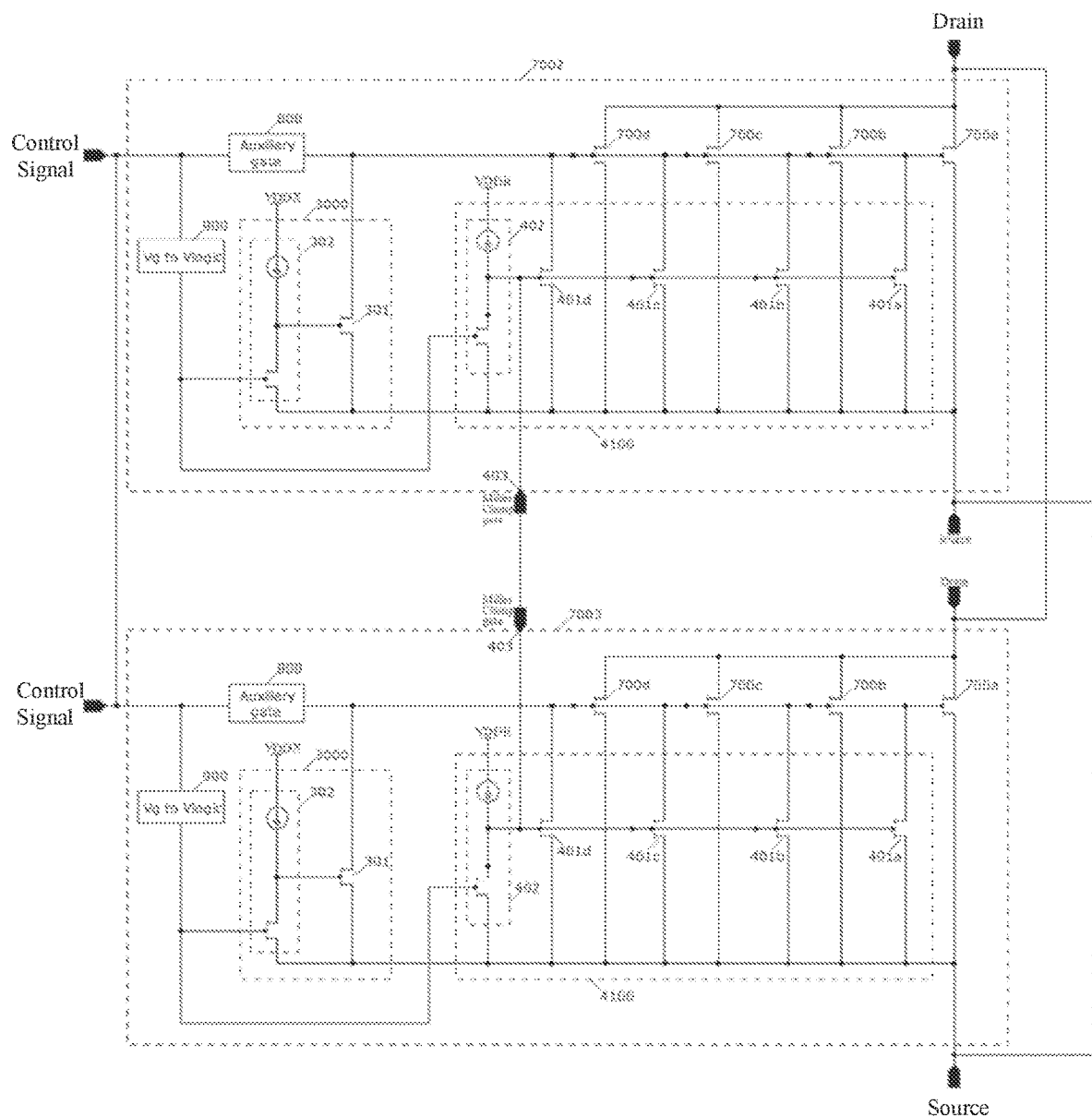
FIG. 21 depicts schematically a block circuit diagram of a second example of parallel power device GaN chips

FIG. 21 shows an additional implementation of parallel GaN chips similar to that shown in FIG. 20. FIG. 21 shows parallel power device GaN chips 7002, 7003, where the GaN chips are similar to the circuits illustrated in FIG. 19. As explained in more detail above with regards to FIG. 19, Miller clamp sub-transistors 401a, 401b, 401c, 401d are connected between the gate and source terminal of a distributed network of the power sub-HEMT 700a, 700b, 700c and 700d. Similarly to FIG. 20, additional connections may be provided between the internal gate terminals of the active heterojunction transistor 700a, 700b, 700c, 700d (not shown here) or the gates of the active Miller clamps (as extra pins 403) such that when connected in parallel, and when switching, the first Miller clamp that comes on switches all the other main HEMT transistors in the chip 7002, 7003 off.

Figure 22:
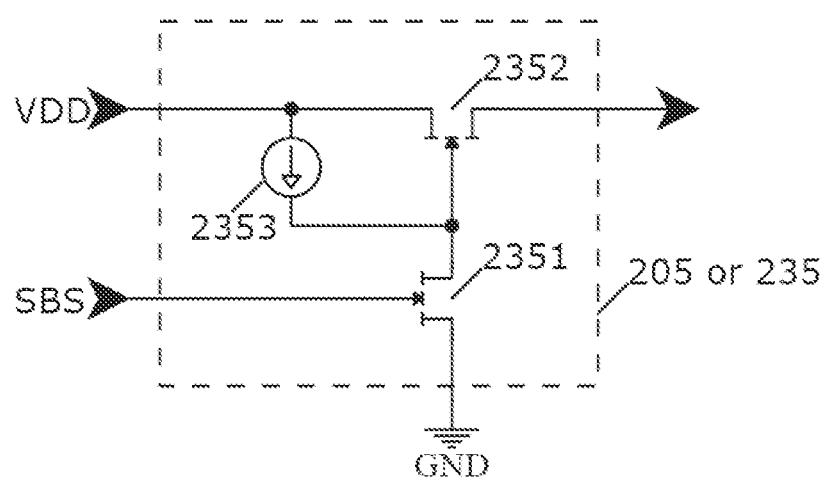
FIG. 22 depicts a circuit diagram of an example switch for use in a linear voltage regulator.

FIG. 22 shows a circuit schematic of an implementation of the switches 205, 235 illustrated in FIG. 11 and FIG. 13. The circuit comprises two enhancement mode HEMTs 2351, 2352 and a current source 2353. If the stand-by signal is low, the HEMT 2351 is in the off-state and the gate of HEMT 2352 can be pulled up by the current source to a potential close to VDD. Under this conditions, HEMT 2352 is conductive. If the stand-by signal is high, then HEMT 2352 is in the on-state and gate of HEMT 2352 is pulled close to ground. Under this condition, HEMT 2352 is not conductive.

LIST OF REFERENCE NUMERALS

1 AlGaN layer
2 GaN layer
3 Transition layer
4 Silicon substrate
5 Substrate terminal
6 SiO2 passivation layer
7 Surface passivation dielectric layer
8 Source terminal
9 Drain terminal
10 Gate terminal
11 p-doped GaN cap
50 Power IC in normal operation
51 Control signal absent for set time?
52 Generate stand-by signal
53 Disable selected circuit blocks
54 Switch linear voltage regulator to low power consumption state
55 VDD>Set value
56 Generate UVLO signal
57 Cut control signal path to inner gate terminal
58 Disable high power consumption rail
59 Disable connection between high and low power consumption output rail
80 Capacitive element
81 Capacitive element
100 Stand by signal generation circuit
100a Stand by signal generation circuit
101 Inverter circuit
102 Inverter circuit
103 Current source
104 Current mirror
105 Enhancement mode HEMT
106 Enhancement mode HEMT
107 Capacitive element
200 Voltage regulator
200a-c Voltage regulator
201 Potential divider
202 Depletion mode HEMT
203 Current source
204 Enhancement mode HEMT
205 Switch
206 Depletion mode HEMT
207 Potential divider
208 Current source
209 Enhancement mode HEMT
210 Capacitive element
211 Capacitive element
212 Transistor
213 Current source path
214 Transistor
215 Resistive element
216 Diodes
217 Transistor
218 Potential divider
219 Transistor
220 Capacitive element
221 Enhancement mode HEMT
222 Enhancement mode HEMT
223 Diode
224 Enhancement mode HEMT
225 Depletion mode HEMT
226 Resistive element
228 Capacitive element
229 Transistor
230 Resistive element
231 Resistive element
232 Transistor
234 Current source
235 Switch
300 IC blocks enabled during stand-by
301 Miller clamp transistor
302 Inverter
400 IC blocks disabled during stand-by
401 Miller clamp transistor
401a-d Miller clamp sub-transistor
402 Inverter
403 Extra pins
500 Decoupling circuit
600 Under voltage lockout circuit (UVLO)
600a,b Under voltage lockout circuit (UVLO)
601 Potential divider
602 Inverter
603 Inverter
604 Current source
605 Enhancement mode HEMT
606 Transistor
607 Enhancement mode HEMT
608 Capacitive element
609 Inverter
610 Inverter
611 Current mirroring circuit
612 Current mirroring circuit
613 Current mirroring circuit
614 Potential divider 615 Enhancement mode HEMT
700 Enhancement mode HEMT
700a-d Enhancement mode HEMT
701 Gate terminal
800 Auxiliary gate circuit
900 Circuit block
1000 Level shift circuit
1000a Level shift circuit
1001 Source-gate connected HEMT
1002 Source-gate connected HEMT
2000 Low power consumption circuit
2001 High power consumption circuit
2002 High power consumption circuit
2003 High power consumption circuit
2004 Voltage rail output circuit
2351 Enhancement mode HEMT
2352 Enhancement mode HEMT
2353 Current source
3000 Circuit block enabled during a stand-by operation
4000 Circuit block disabled during a stand-by operation
4100 Circuit block disabled during a stand-by operation
7000 GaN chip
7001 GaN chip
7002 GaN chip
7003 GaN chip In this disclosure, unless explicitly specified, the heterojunction transistors may be any known transistor based on a heterojunction such as a p-Gate HEMT transistor, or a Schottky gate transistor or an insulated gate transistor such as MISFET (Metal Insulating Semiconductor Field Effect Transistor). The diodes can be Schottky diodes, Zener diodes or pn diodes or diodes made of a transistor by connecting the gate terminal with any of its other terminals. The heterojunction chip or the heterojunction power device described in this disclosure can be referred to as a heterojunction smart power device or heterojunction smart chip or heterojunction power integrated circuit or heterojunction integrated circuit.

The skilled person will understand that in the preceding description and appended claims, positional terms such as 'top', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

The invention claimed is:

1. A III-nitride power semiconductor based heterojunction device comprising:
a substrate;
a first terminal;
a second terminal;
a control terminal configured to receive an input switching signal during an active mode of operation and to not receive the input switching signal during a stand-by mode of operation;
an active heterojunction transistor formed on the substrate, the active heterojunction transistor comprising:
a first III-nitride semiconductor region comprising a first heterojunction comprising an active two-dimensional carrier gas;
a source terminal operatively connected to the III-nitride semiconductor region and further connected to the first terminal;
a drain terminal laterally spaced from the first terminal and operatively connected to the III-nitride semiconductor region, the drain terminal operatively connected to the second terminal; and
an active gate region formed over the III-nitride semiconductor region and between the first terminal and the second terminal;
a stand-by signal generation circuit configured to generate a stand-by signal when the input switching signal to the control terminal has not been detected for a set period of time;
at least one Miller clamp transistor and driving circuitry associated with the at least one Miller clamp transistor;
a voltage regulator circuit configured to provide at least a low power consumption output and a high power consumption output, wherein the low power consumption output is enabled at least during the stand-by mode of operation and the high power consumption output is disabled by the stand-by signal during the stand-by mode of operation; and
a rail voltage terminal configured to provide an input to the voltage regulator circuit;
wherein the low power consumption output is provided to the driving circuitry of the at least one Miller clamp transistor to thereby maintain the at least one Miller clamp transistor in an on-state during the stand-by mode of operation; and
wherein the low power consumption output is provided to the stand-by signal generation circuit to thereby power up the stand-by signal generation circuit.

2. The heterojunction device of claim 1, wherein the heterojunction device comprises at least one of:
a capacitor connected between the high power consumption output and the source terminal; and
a capacitor connected between the low power consumption output and the source terminal.

3. The heterojunction device of claim 2, wherein the capacitor connected to the high power consumption output is configured to discharge to ground during the stand-by mode of operation.

4. The heterojunction device of claim 1, wherein during the active mode of operation, the circuit delivering the high power consumption output is configured to draw a higher quiescent current than the circuit delivering the low power consumption output.

5. The heterojunction device of claim 1, wherein the stand-by signal generation circuit comprises a capacitor, and wherein the heterojunction device is configured to charge the capacitor when the input switching signal is high and discharge the capacitor when the input switching signal is low; and wherein a resistance of a charge path of the capacitor is less than the resistance of a discharge path of the capacitor.

6. The heterojunction device of claim 5, comprising a current mirror circuit configured to set a maximum discharge current of the capacitor.

7. The heterojunction device of claim 5, wherein the stand-by signal generation circuit is configured to provide a first output when the capacitor charge is above a threshold level and a second output when the capacitor charge is below the threshold level.

8. The heterojunction device of claim 1, wherein the high power consumption output is connected to at least one of:
   a second Miller clamp transistor and its associated driving circuit;
   a current sense amplifier;
   a current over protection circuit;
   a temperature sensing circuit;
   an over-temperature protection circuit;
   a slew rate control circuit; and/or
   an under voltage detection or lock out circuit.

9. The heterojunction device of claim 8, wherein the second Miller clamp transistor forms part of a pull-down circuit, the pull-down circuit comprising a distributed network of pull-down sub-circuits connected to a network of active heterojunction sub-transistors.

10. The heterojunction device of claim 1, wherein the Miller clamp transistor and its associated driving circuit are operatively connected to the low power consumption output via a level-shift circuit, optionally wherein the level-shift circuit comprises a source-gate connected transistor or a fixed gate bias transistor.

11. The heterojunction device of claim 10, comprising a decoupling circuit operatively connected between the high power consumption output and the low power consumption output, wherein the decoupling circuit is configured to be enabled or disabled by the stand-by signal, and wherein:
   when the stand-by signal is less than a threshold value, the de-coupling circuit is enabled to thereby operatively connect the high power consumption output to the low power consumption mode output; and
   when the stand-by signal is more than the threshold value, the de-coupling circuit is disabled to thereby disconnect the high power consumption output and the low power consumption mode output.

12. The heterojunction device of claim 11, wherein the de-coupling circuit is configured to operate as a low pass filter.

13. The heterojunction device of claim 1, comprising an under voltage detection circuit configured to generate an under voltage condition signal when an input voltage signal to the rail voltage terminal drops below a threshold value;
   wherein the heterojunction device is configured to disconnect the input switching signal from the gate terminal of the active heterojunction transistor upon a detection of the under voltage condition signal.

14. The heterojunction device of claim 13, wherein the under voltage detection circuit is configured to receive an input voltage signal from the rail voltage terminal; and
   the under voltage detection circuit comprises a potential divider, wherein a midpoint of the potential divider is configured to provide a voltage signal which divides the input voltage signal according to a ratio of resistors in the potential divider.

15. The heterojunction device of claim 14, wherein the under voltage detection circuit comprises a capacitor, and wherein the heterojunction device is configured to charge the capacitor when the divided input voltage signal is above a threshold level and discharge the capacitor when the divided input voltage signal is below the threshold level.

16. The heterojunction device of claim 15, where the under voltage detection circuit is configured to provide a first output when a capacitor charge is above a threshold level and a second output when the capacitor charge is below the threshold level.

17. The heterojunction device of claim 16, wherein a resistive ratio of the potential divider is dependent on whether the under voltage condition signal transitions from a low to high value or a high to low value.

18. The heterojunction device of claim 13, wherein the voltage regulator circuit is configured to receive the under voltage condition signal as an input signal, and wherein the voltage regulator is configured to operate in a low power consumption mode or a high power consumption mode based on under voltage condition signal.

19. The heterojunction device of claim 1, wherein the voltage regulator comprises:
   a first transistor operatively connected in series between an input and an output of the voltage regulator, wherein the first transistor is an enhancement or depletion mode transistor;
   a current source operatively connected between the input of the voltage regulator and a gate of the enhancement or depletion mode transistor;
   a second transistor, wherein the second transistor is an enhancement mode transistor and wherein a drain of the second transistor is operatively connected to the gate of the first transistor; and
   a potential divider, where a midpoint of the potential divider is operatively connected to a gate of the second transistor.

20. The heterojunction device of claim 1, wherein the heterojunction device is connected in parallel to one or more second heterojunction devices, such that:
   the control terminal of the heterojunction device is operably connected to a control terminal of the one or more second heterojunction devices;
   the drain terminal of the heterojunction device is operably connected to a drain terminal of the one or more second heterojunction devices; and
   the source terminal of the heterojunction device is operably connected to a source terminal of the one or more second heterojunction devices.

21. The heterojunction device of claim 20, wherein the active gate region of the active heterojunction transistor is operatively connected to corresponding active gate regions of the one or more second heterojunction devices.

22. The heterojunction device of claim 20, wherein a gate of the Miller clamp transistor is operatively connected to corresponding gates of Miller clamp transistors of the one or more second heterojunction devices.

23. The heterojunction device of claim 22, wherein the Miller clamp transistor comprises Miller clamp sub-transistors, and wherein one or more gates of the Miller clamp sub-transistors are operatively connected to corresponding gates of Miller clamp sub-transistors of the one or more second heterojunction devices.

24. The heterojunction device of claim 9, wherein the heterojunction device is connected in parallel to one or more second heterojunction devices, such that:
   the control terminal of the heterojunction device is operably connected to a control terminal of the one or more second heterojunction devices;

the drain terminal of the heterojunction device is operably connected to a drain terminal of the one or more second heterojunction devices;

the source terminal of the heterojunction device is operably connected to a source terminal of the one or more second heterojunction devices; and wherein a gate of the second Miller clamp transistor is operatively connected to corresponding gates of second Miller clamp transistors of the one or more second heterojunction devices.

25. The heterojunction device of claim 1, wherein the voltage regulator comprises a depletion mode transistor, and wherein:

a voltage rating of the depletion mode transistor is substantially equal to a voltage rating of the active heterojunction transistor;

a gate terminal of the depletion mode transistor is operatively connected to the source terminal of the active heterojunction transistor;

a drain terminal of the depletion mode transistor is either operatively connected to the drain terminal of the active heterojunction transistor or provided as an additional external terminal; and a source terminal of the depletion mode transistor is operatively connected to the low power consumption output.

26. The heterojunction device of claim 25, comprising a resistor operatively connected in series between the source terminal of the depletion mode transistor and the low power consumption output.

27. The heterojunction device of claim 1, comprising an auxiliary gate transistor operatively connected between the control terminal and the active gate region of the active heterojunction transistor.

* * * * *